(12) United States Patent
Choi

(10) Patent No.: US 12,402,312 B2
(45) Date of Patent: Aug. 26, 2025

(54) METHOD OF MANUFACTURING SEMICONDUCTOR DEVICE

(71) Applicant: Samsung Electronics Co., Ltd., Suwon-si (KR)

(72) Inventor: Daehwan Choi, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 525 days.

(21) Appl. No.: 17/954,968

(22) Filed: Sep. 28, 2022

(65) Prior Publication Data
US 2023/0217658 A1 Jul. 6, 2023

(30) Foreign Application Priority Data
Jan. 4, 2022 (KR) .................. 10-2022-0000680

(51) Int. Cl.
*H10B 43/27* (2023.01)
*H10B 41/10* (2023.01)
(Continued)

(52) U.S. Cl.
CPC ............ *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 43/27; H10B 41/10; H10B 41/27; H10B 41/35; H10B 43/10; H10B 43/35;
(Continued)

(56) References Cited

U.S. PATENT DOCUMENTS 9,230,985 B1 * 1/2016 Wu ..................... H10D 30/031
2014/0145137 A1   5/2014 Ju et al.
(Continued)

FOREIGN PATENT DOCUMENTS

KR   10-2012-0097594 A   9/2012
KR   10-2014-0000103 A   1/2014
(Continued)

OTHER PUBLICATIONS

Eugene Chong, et al. "Effect of oxygen on the threshold voltage of a-IGZO TFT", Journal of Electrical Engineering & Technology vol. 6, No. 4, pp. 539-542 (2011).
(Continued)

*Primary Examiner* — David Vu
(74) *Attorney, Agent, or Firm* — Harness, Dickey & Pierce, P.L.C.

(57) ABSTRACT

A method of manufacturing a semiconductor device includes forming a stacked structure by stacking gate layers and interlayer insulating layers alternately on a substrate; and forming a channel structure passing through the stacked structure in a vertical direction, wherein the forming a channel structure includes forming an opening by etching the stacked structure; forming a gate insulating layer covering a side surface of the opening; forming a variable resistive material layer on the gate insulating layer; changing an oxygen vacancy concentration in a region of the variable resistive material layer by performing a plasma treatment process or an annealing process on the variable resistive material layer; forming a core insulating pattern covering the variable resistive material layer and filling at least a portion of the opening; and forming a pad pattern on the core insulating pattern.

20 Claims, 29 Drawing Sheets

(51) Int. Cl.
*H10B 41/27* (2023.01)
*H10B 41/35* (2023.01)
*H10B 43/10* (2023.01)
*H10B 43/35* (2023.01)
*H10N 70/00* (2023.01)

(58) Field of Classification Search
CPC ...... H10B 63/30; H10B 63/34; H10B 63/845; H10B 43/50; H10D 64/037; H10N 70/041; H10N 70/24; H10N 70/826; H10N 70/8833; H10N 70/8836
See application file for complete search history.

(56) References Cited

U.S. PATENT DOCUMENTS

| | | |
|---|---|---|
| 2014/0264321 A1 | 9/2014 | Liang et al. |
| 2019/0006386 A1 | 1/2019 | Yamazaki et al. |
| 2019/0067375 A1 | 2/2019 | Karda et al. |
| 2021/0183886 A1 | 6/2021 | Choi et al. |
| 2021/0202577 A1 | 7/2021 | Han et al. |
| 2021/0217473 A1 | 7/2021 | Cho et al. |
| 2021/0257407 A1 | 8/2021 | Han et al. |
| 2021/0257409 A1 | 8/2021 | Han et al. |
| 2021/0384258 A1 | 12/2021 | Hwang |

FOREIGN PATENT DOCUMENTS

| | | |
|---|---|---|
| KR | 10-2014-0068627 A | 6/2014 |
| KR | 101531154 B1 | 6/2015 |
| KR | 10-2019-0123163 A | 10/2019 |
| KR | 10-2020-0036950 A | 4/2020 |
| KR | 102179934 B1 | 11/2020 |
| KR | 10-2021-0077383 A | 6/2021 |
| KR | 10-2021-0085573 A | 7/2021 |
| KR | 10-2021-0091583 A | 7/2021 |
| KR | 10-2021-0103305 A | 8/2021 |

OTHER PUBLICATIONS

Jun Tae Jang, et al. "Effects of structure and oxygen flow rate on the photo-response of amorphous IGZO-based photodetector devices", Solid State Electronics, http://dx.doi.org/10.1016/j.sse.2017.10.028, pp. 1-7 (2017).

* cited by examiner

METHOD OF MANUFACTURING SEMICONDUCTOR DEVICE

CROSS-REFERENCE TO RELATED APPLICATION(S)

This application claims benefit of priority to Korean Patent Application No. 10-2022-0000680 filed on Jan. 4, 2022 in the Korean Intellectual Property Office, the disclosure of which is incorporated herein by reference in its entirety.

BACKGROUND

Some example embodiments relate to a method of manufacturing or fabricating a semiconductor device and/or a semiconductor device.

In a data storage system requiring data storage, a semiconductor device capable of storing high-capacity data is required or desired. Accordingly, a method of increasing data storage capacity of a semiconductor device is being researched. For example, as a method for increasing the data storage capacity of a semiconductor device, a semiconductor device including three-dimensionally arranged memory cells, instead of two-dimensionally arranged memory cells, has been proposed.

SUMMARY

Some example embodiments may provide a method of manufacturing a semiconductor device having improved electrical characteristics and/or a simplified manufacturing process.

Alternatively or additionally, some example embodiments may provide a semiconductor device having improved electrical characteristics and a simplified manufacturing process, and/or a data storage system including the same.

According some example embodiments, a method of manufacturing a semiconductor device includes forming a stacked structure by stacking gate layers and interlayer insulating layers alternately on a substrate; and forming a channel structure passing through the stacked structure in a vertical direction, wherein the forming a channel structure includes forming an opening by etching the stacked structure; forming a gate insulating layer covering at least a side surface of the opening; forming a variable resistive material layer on the gate insulating layer; changing an oxygen vacancy concentration in a region of the variable resistive material layer by performing one or both of a plasma treatment process or an annealing process on the variable resistive material layer; forming a core insulating pattern that covers the variable resistive material layer and fills at least a portion of the opening, after the performing the one or both of plasma treatment process and the annealing process; and forming a pad pattern on the core insulating pattern.

According to some example embodiments, a method of manufacturing a semiconductor device includes forming a stacked structure by stacking gate layers and interlayer insulating layers alternately on a substrate; and forming a channel structure passing through the stacked structure in a vertical direction. The forming a channel structure includes forming an opening by etching the stacked structure; forming a gate insulating layer covering at least a side surface of the opening; forming a variable resistive material layer on the gate insulating layer and including a first region and a second region; changing an oxygen vacancy concentration in a first subregion of the first region or a second subregion of the second region; forming a core insulating pattern filling at least a portion of the opening; and forming a pad pattern on the core insulating pattern.

According to some example embodiments, a method of manufacturing a semiconductor device includes forming a stacked structure by stacking gate layers and interlayer insulating layers alternately on a substrate; and forming a channel structure passing through the stacked structure in a vertical direction. The forming a channel structure includes forming an opening by etching the stacked structure; forming a gate insulating layer in the opening; forming a variable resistive material capping layer filling the opening and contacting the gate insulating layer; etching a central region of the variable resistive material capping layer to form a variable resistive material layer extending along a side surface of the gate insulation layer and having a specific thickness from the side surface of the gate insulation layer; changing an oxygen vacancy concentration in a region of the variable resistive material layer by performing one or both of a plasma treatment process or an annealing process on the variable resistive material layer; forming a core insulating pattern that covers the variable resistive material layer and that fills at least a portion of the opening, after performing the one or both of the plasma treatment process or the annealing process; and forming a pad pattern on the core insulating pattern.

According to some example embodiments, a semiconductor device includes a substrate; gate electrodes stacked on the substrate and spaced apart from each other in a vertical direction; and a channel structure in an opening that passes through the gate electrodes in the vertical direction. The channel structure includes a core insulating pattern spaced apart from a side surface of the opening, a gate insulating layer contacting the gate electrodes at the side surface of the opening, and a variable resistive material layer between the gate insulating layer and the core insulating pattern. The variable resistive material layer includes a channel region including oxygen vacancies at a first concentration, and an data storage region including oxygen vacancies at a second concentration, less than the first concentration, wherein the channel region is in contact with the gate insulating layer and extends along a side surface of the gate insulating layer, and the data storage region is in contact with the core insulating pattern and extends along a side surface of the core insulating pattern.

According to some example embodiments, a data storage system includes a semiconductor storage device including a lower substrate, a lower structure including circuit elements on the lower substrate, an upper structure on the lower structure, an input/output pad electrically connected to the circuit elements; and a controller electrically connected to the semiconductor storage device through the input/output pad and configured to control the semiconductor storage device, wherein the semiconductor storage device includes an upper substrate; gate electrodes stacked on the upper substrate spaced apart from each other in a vertical direction; and a channel structure in an opening that passes through the gate electrodes in the vertical direction. The channel structure includes a core insulating pattern spaced apart from a side surface of the opening, a gate insulating layer contacting the gate electrodes at the side surface of the opening, and a variable resistive material layer between the gate insulating layer and the core insulating pattern. The variable resistive material layer includes a channel region including oxygen vacancies at a first concentration, and an data storage region including oxygen vacancies at a second concentration, less than the first concentration, wherein the channel region is in contact with the gate insulating layer and extends along a side surface of the gate insulating layer, and the data storage region is in contact with the core insulating pattern and extends along a side surface of the core insulating pattern.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, various example embodiments of inventive concepts will be described with reference to the accompanying drawings.

Figure 1:
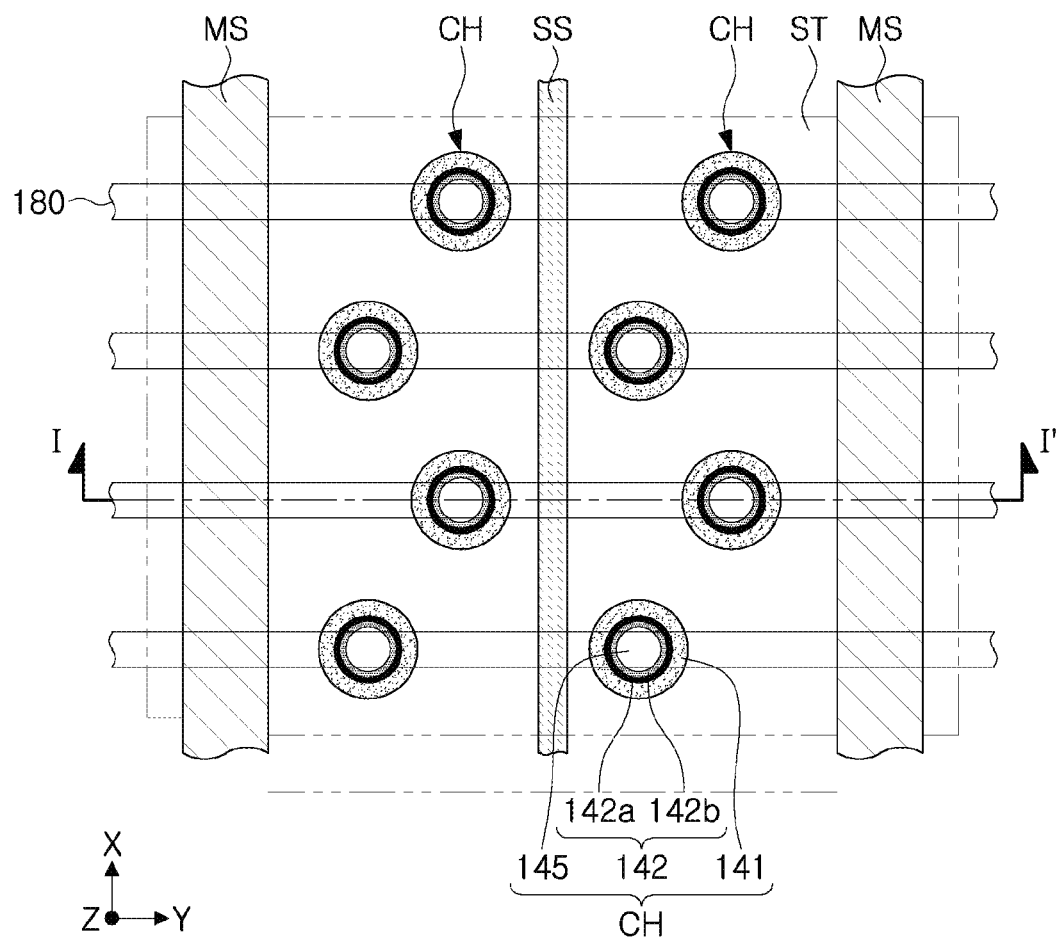
FIG. 1 is a schematic plan view of a semiconductor device according to various example embodiments.

FIG. 1 is a schematic plan view of a semiconductor device according to various example embodiments.

Figure 2:
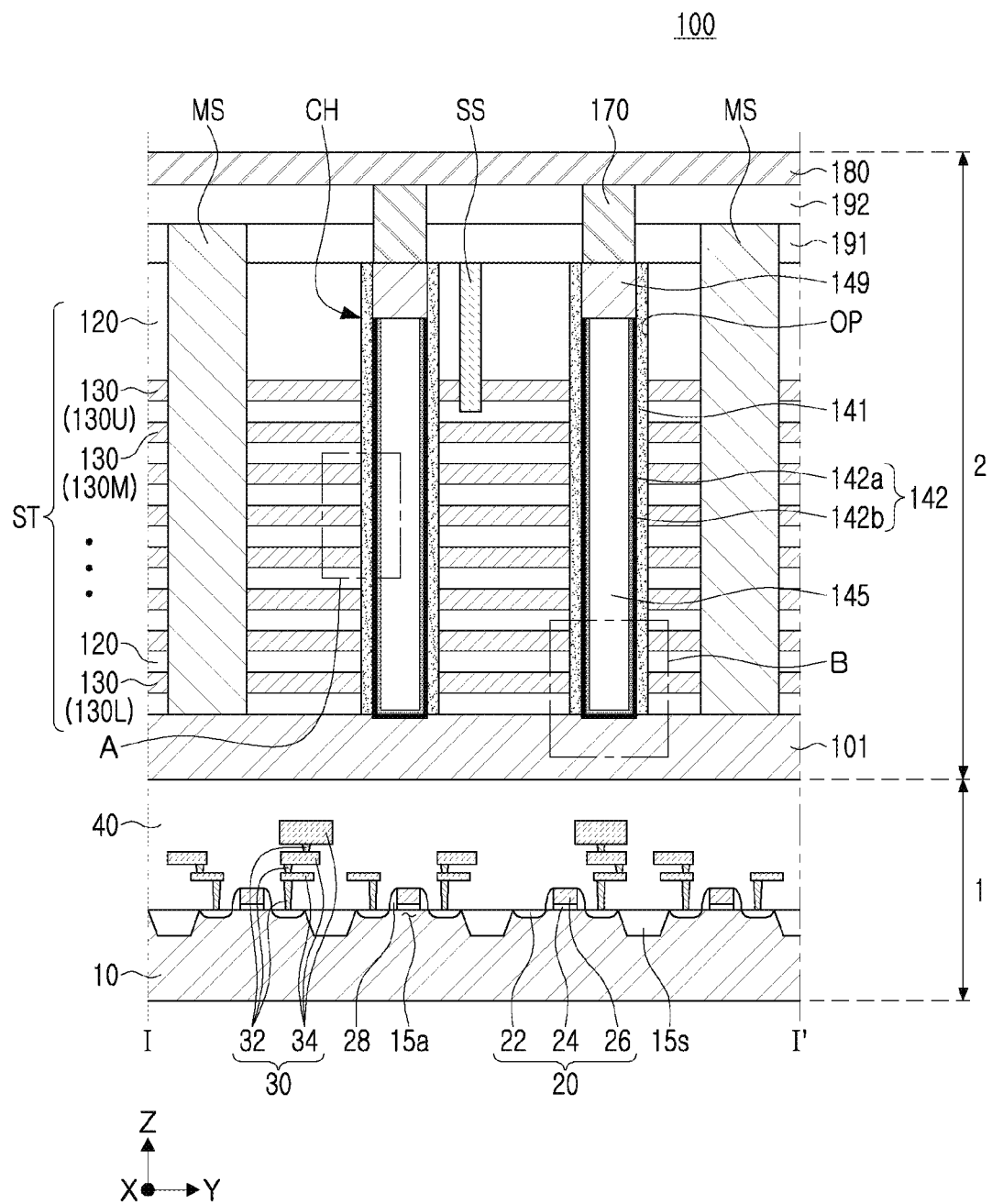
FIG. 2 is a schematic cross-sectional view of a semiconductor device according to various example embodiments.

FIG. 2 is a schematic cross-sectional view of a semiconductor device according to various example embodiments. FIG. 2 illustrates a cross-sectional view taken along line I-I' of FIG. 1.

Figure 3:
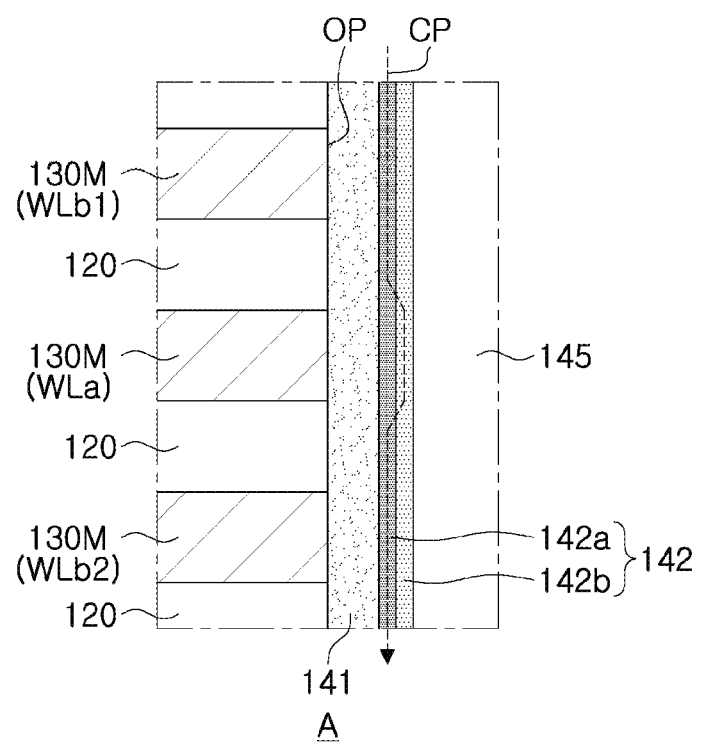
FIG. 3 is a partially enlarged view of a portion of a semiconductor device according to various example embodiments.

FIG. 3 is a partially enlarged view of a portion of a semiconductor device according to various example embodiments. FIG. 3 illustrates an enlarged view of portion 'A' of FIG. 2.

Referring to FIGS. 1 to 3, a semiconductor device 100 may include a first structure 1 including a lower substrate 10 and a second structure 2 including an upper substrate 101. The second structure 2 may be disposed on the first structure 1. The first structure 1 may be or correspond to a region in which a peripheral circuit region of the semiconductor device 100 is disposed, and the peripheral circuit region may include one or more of a column decoder, a row decoder, a page buffer, other peripheral circuits, a redundancy circuit, and the like. The second structure 2 may be a region in which memory cells of the semiconductor device 100 are disposed, and may include gate electrodes 130, channel structures CH, and the like. The semiconductor device 100 may be or may include a cell-over-peri (COP) semiconductor device; however, example embodiments are not limited thereto.

The first structure 1 may include a lower substrate 10, device isolation layers 15s defining an active region 15a on the lower substrate 10, circuit elements 20 disposed on the lower substrate 10, a lower interconnection structure 30 electrically connected to the circuit elements 20, and a lower insulating layer 40.

The lower substrate 10 may include a semiconductor material, for example, one or more of a group IV semiconductor, a group III-V compound semiconductor, or a group II-VI compound semiconductor. The lower substrate 10 may be provided as a bulk wafer or an epitaxial layer. The lower substrate 10 may be doped, e.g. may be lightly doped with one or more of boron, arsenic, or phosphorus; however, example embodiments are not limited thereto. The lower substrate 10 may be disposed below an upper substrate 101. The device isolation layers 15s may be disposed in the lower substrate 10, and source/drain regions 22 including impurities such as one or more of boron, phosphorus, or arsenic may be disposed in a portion of the active region 15a.

The circuit elements 20 may each include a transistor such as a planar transistor including a source/drain region 22, a circuit gate dielectric layer 24, and a circuit gate electrode 26. The source/drain regions 22 may be disposed on both sides of the circuit gate electrode 26 in the active region 15a. The circuit gate dielectric layer 24 may be disposed between the active region 15a and the circuit gate electrode 26. Spacer layers 28 may be disposed on both sides of the circuit gate electrode 26. The circuit gate electrode 26 may include, for example, a material layer such as one or more of tungsten (W), titanium (Ti), tantalum (Ta), tungsten nitride (WN), titanium nitride (TiN), tantalum nitride (TaN), polysilicon, or a metal-semiconductor compound.

The lower interconnection structure 30 may be electrically connected to the circuit elements 20. The lower interconnection structure 30 may include a lower contact 32 and a lower interconnection 34. A portion of lower contacts 32 may extend in a Z-direction to be connected to the source/drain regions 22. The lower contact 32 may electrically connect the lower interconnections 34 disposed on different levels to each other. The lower interconnection structure 30 may include a conductive material, for example, a metal material such as one or more of tungsten (W), titanium (Ti), tantalum (Ta), copper (Cu), aluminum (Al), cobalt (Co), molybdenum (Mo), ruthenium (Ru), or the like. A barrier layer formed of a material such as one or more of tungsten nitride (WN), titanium (Ti), titanium nitride (TiN), or the like may be disposed on bottom and side surfaces of the lower interconnection structure 30. The number of layers and arrangement of the lower contacts 32 and the lower interconnections 34, constituting the lower interconnection structure 30, may be variously changed. At least a portion of the lower interconnections 34 may include a pad layer to which a plurality of through-contact plugs extending downwardly from the second structure 2 are directly connected. In some example embodiments, the plurality of through-contact plugs may be disposed to pass through a through-region formed in a stacked structure ST of the second structure 2.

The lower insulating layer 40 may be disposed to cover the lower substrate 10, the circuit elements 20, and the lower interconnection structure 30. The lower insulating layer 40 may be formed of an insulating material such as silicon oxide and/or silicon nitride. The lower insulating layer 40 may include a plurality of insulating layers. The lower insulating layer 40 may include an etch stop layer formed of silicon nitride.

The second structure 2 may include an upper substrate 101 on the first structure 1, a stacked structure ST including gate electrodes 130 spaced apart and stacked on the upper substrate 101, first separation patterns MS passing through the stacked structure ST and separating the gate electrodes 130, channel structures CH passing through the stacked structure ST, a second separation pattern SS separating upper gate electrodes 130U among the gate electrodes 130 between the first separation patterns MS, and bit lines 180 disposed on the stacked structure ST. The second structure 2 may further include interlayer insulating layers 120 with which the gate electrodes 130 are alternately stacked and forming a portion of the stacked structure ST, and contact plugs 170 and upper insulating layers 191 and 192, arranged between the channel structures CH and the bit lines 180.

The upper substrate 101 may include a semiconductor material, for example, one or more of a group IV semiconductor, a group III-V compound semiconductor, or a group II-VI compound semiconductor. The upper substrate 101 may include, for example, a polysilicon layer having N-type or P-type conductivity. The upper substrate 101 may include an impurity region contacting the channel structure CH.

The gate electrodes 130 may be stacked on the upper substrate 101 to be spaced apart from each other in the Z-direction, and may form a portion of the stacked structure ST. The gate electrodes 130 may extend in the X-direction. The gate electrodes 130 may include a lower gate electrode 130L forming a gate of a ground select transistor, memory gate electrodes 130M forming a plurality of memory cells, and upper gate electrodes 130U forming gates of string select transistors. The number of the memory gate electrodes 130M constituting the memory cells may be determined according to capacity of the semiconductor device 100. In some example embodiments, the number of the gate electrodes constituting the string select transistor may be one or two or more, and the number of the gate electrodes constituting the ground select transistor may be one or two or more.

The gate electrodes 130 may be vertically spaced apart and stacked on the upper substrate 101, and although not illustrated, may extend by different lengths in a Y-direction to form a stepped structure or a stair structure. The gate electrodes 130 may have pad regions in which a lower gate electrode among the gate electrodes 130 is extended to be longer than an upper gate electrode among the gate electrodes 130 due to the stepped structure. Gate contact plugs may be connected to the gate electrodes 130 through the pad regions of the gate electrodes 130. In some example embodiments, the gate contact plugs may be electrically connected to the circuit elements 20 of the first structure 1 through through-contact plugs passing through a through-region disposed in the stacked structure ST.

The gate electrodes 130 may be arranged to be separated from each other in the Y-direction by the first separation patterns MS extending in an X-direction. The gate electrodes 130 between a pair of first separation patterns MS may form one memory block, but a scope of the memory block is not limited thereto. The gate electrodes 130 may include a first layer and a second layer, respectively. The first layer may cover upper and lower surfaces of the second layer, and may extend between the channel structures CH and the second layer. The first layer may include a high-k material such as aluminum oxide (AlO) or the like, and the second layer may include at least one of titanium (Ti), titanium nitride (TiN), tantalum (Ta), tantalum nitride (TaN), tungsten (W), or tungsten nitride (WN). In some example embodiments, the gate electrodes 130 may include polysilicon and/or a metal-semiconductor compound.

The interlayer insulating layers 120 may be disposed between the gate electrodes 130, and may form the stacked structure ST. Like the gate electrodes 130, the interlayer insulating layers 120 may be spaced apart from each other in the Z-direction, and may be disposed to extend in the X-direction. The interlayer insulating layers 120 may include an insulating material such as silicon oxide. A portion of the interlayer insulating layers 120 may have different thicknesses. For example, an uppermost interlayer insulating layer 120, among the interlayer insulating layers 120, may have a thickness, greater than a thickness of each of the other interlayer insulating layers 120.

The first separation patterns MS may be disposed to pass through the gate electrodes 130 of the stacked structure ST in the Z-direction, and extend in the X-direction. First separation patterns MS adjacent in the Y-direction may be disposed parallel to each other. The first separation patterns MS may entirely pass through the gate electrodes 130 of the stacked structure ST in the Z-direction, to contact the upper substrate 101. The first separation patterns MS may be formed of an insulating material, for example, silicon oxide. In some example embodiments, each of the first separation patterns MS may include a core pattern including a conductive material and contacting the upper substrate 101, and a separation insulation pattern covering a side surface of the core pattern and including an insulating material.

As illustrated in FIG. 1, the channel structures CH may form a memory cell string, and may be disposed to be spaced apart from each other while forming rows and columns. The channel structures CH may be disposed to form a grid pattern between the first separation patterns MS or may be disposed to form a zigzag shape in a direction. The channel structures CH may be disposed in an opening OP passing through the stacked structure ST in the Z-direction. The channel structures CH may have a pillar shape, and may have inclined side surfaces, narrower in width, as they approach the upper substrate 101 according to an aspect ratio. The channel structures CH may have a tapered pillar profile.

Each of the channel structures CH may include a gate insulating layer 141, a variable resistive material layer 142, a core insulating pattern 145, and a pad pattern 149. The variable resistive material layer 142 may be formed in an annular shape to cover or surround an outer side surface of the core insulating pattern 145. The gate insulating layer 141 may be formed in an annular shape to cover or surround an outer side surface of the variable resistive material layer 142. The gate insulating layer 141, the variable resistive material layer 142, and the core insulating pattern 145 may be sequentially disposed from side surfaces of the gate electrodes 130. For example, the gate insulating layer 141 may be in contact with the gate electrodes 130 on a side surface of the opening OP, the core insulating pattern 145 may be spaced apart from the side surface of the opening OP, and the variable resistive material layer 142 may be disposed between the gate insulating layer 141 and the core insulating pattern 145.

The gate insulating layer 141 may be disposed between the gate electrodes 130 and the variable resistive material layer 142. The gate insulating layer 141 may extend along the side surface of the opening OP. The gate insulating layer 141 may extend from a level lower than the lower gate electrode 130L to a level higher than the upper gate electrode 130U. An upper surface of the gate insulating layer 141 may be coplanar with or substantially coplanar with an upper surface of the pad pattern 149. The gate insulating layer 141 may be formed of silicon oxide or doped silicon oxide such as nitrogen-doped silicon oxide.

The variable resistive material layer 142 may cover side and lower surfaces of the core insulating pattern 145, and may be in contact with the upper substrate 101. The variable resistive material layer 142 may be formed as a single layer including a transition metal oxide, and may include regions having different oxygen vacancy concentrations. For example, the variable resistive material layer 142 may include a first region 142a (corresponding to a 'channel region' of a memory cell transistor, and, hereinafter, referred to as a 'channel region') having an oxygen vacancy of a first concentration, and a second region 142b (corresponding to an 'data storage region' of the memory cell transistor, and, hereinafter, referred to as a 'data storage region') having an oxygen vacancy of a second concentration, different from the first concentration. The second concentration may be lower than the first concentration. As used herein, an "oxygen vacancy" may refer to a point, such as a point defect, in a unit cell of a crystalline lattice of atoms in an oxide crystal that is absent of an oxygen atom. An oxygen vacancy concentration may indicate a concentration in units of vacancies per volume of unit cells in an oxide crystalline lattice that are void of oxygen.

An oxygen vacancy concentration in the channel region 142a of the variable resistive material layer 142 may be greater than an oxygen vacancy concentration in the data storage region 142b of the variable resistive material layer 142. The channel region 142a may be in contact with the gate insulating layer 141, and the data storage region 142b may be in contact with the core insulating pattern 145. In the drawings, a line between the channel region 142a and the data storage region 142b is illustrated for convenience of explanation, but an interface between the channel region 142a and the data storage region 142b may not exist. Since the channel region 142a and the data storage region 142b may be regions formed of the same material, resistance therebetween may be relatively lower than contact resistance due to an interface formed between them, formed of different materials.

A lower portion of the channel region 142a of the variable resistive material layer 142 may be in contact with the upper substrate 101. Since the channel region 142a of the variable resistive material layer 142 corresponds to a channel region of the memory cell transistor as described above, a further channel layer may not be disposed between the variable resistive material layer 142 and the gate insulating layer 141. For example, the variable resistive material layer 142 may be in contact with the gate insulating layer 141 without interposing a polysilicon layer between the variable resistive material layer 142 and the gate insulating layer 141. For example, the channel region 142a of the variable resistive material layer 142 may not include polysilicon. The channel region 142a of the variable resistive material layer 142 may be a region in which a portion of the variable resistive material layer 142 is subjected to a plasma treatment process and/or an annealing process to increase an oxygen vacancy concentration. The annealing process may be or may include a thermal annealing process and/or a laser annealing process. Since a portion of the variable resistive material layer 142 may be post-processed to change electrical characteristics, and may be used as the channel region 142a of the memory cell transistor, an operation of forming a further channel layer including a material, different from the variable resistive material layer 142, may be omitted. There may be a reduction in fabrication time, and/or an improvement in yield and/or reliability and/or efficiency, from the annealing process and/or the plasma treating process.

The data storage region 142b of the variable resistive material layer 142 may be a region in which a portion of the variable resistive material layer 142 is subjected to a plasma treatment process and/or an annealing process to decrease an oxygen vacancy concentration.

The data storage region 142b of the variable resistive material layer 142 may have different resistance, according to a set state and a reset state in operating the semiconductor device 100. For example, among word lines WL, a program operation may turn off (OFF) selected word line WLa and may turn on (ON) unselected word lines WLb1 and WLb2. In this case, a current indicated by reference numeral CP in FIG. 3 may sequentially flow along a portion of the channel region 141a facing a first unselected word line WLb1 located above the selected word line WLa, the selected word line WLa facing the selected word line WLa, and a portion of the channel region 141a facing a second unselected word line WLb2 located below the selected word line WLa. A dotted line indicated by reference numeral CP in FIG. 3 may indicate a current flow during a program operation. For example, the current flow CP during the program operation may flow along the portion of the channel region 142a facing the first unselected word line WLb1, may shift to the data storage region 142b facing the selected word line WLa, may shift to the portion of the channel region 142a facing the second unselected word line WLb2, and may flow along the portion of the channel region 142a. As a current flows along the data storage region 142b facing the selected word line WLa, resistance of the data storage region 142b may be changed, and a portion of the data storage region 142b facing the selected word line WLa may be in a set state. By such a program operation, resistance of a portion of the data storage region 142b facing the selected word line WLa may be locally lowered.

An erase operation may turn off the selected word line WLa, similarly to the program operation, and may turn off the unselected word lines WLb1 and WLb2, but may flow a current in a direction, opposite to the current flow during the above-described program operation, to change a magnetic field, to change a portion of the data storage region 142b facing the selected word line WLa in a reset state. Due to the erase operation, resistance of the portion of the data storage region 142b facing the selected word line WLa may be locally increased.

For example, the variable resistive material layer 142 may include at least one of hafnium oxide (HfO), zinc oxide (ZnO), indium oxide (InO), gallium oxide (GaO), tin oxide (SnO), copper oxide (CuO), molybdenum oxide (MoO), hafnium-silicon oxide (HSO), hafnium-zinc oxide (HZO), indium-zinc oxide (IZO), indium-gallium oxide (IGO), indium-tin oxide (ITO), indium-gallium-zinc oxide (IGZO), or indium-tin-zinc oxide (ITZO)

The core insulating pattern 145 may have a prismatic shape or a cylindrical shape extending in the vertical direction (Z). The core insulating pattern 145 may be disposed in a region including a center of the channel structure CH. An upper surface of the core insulating pattern 145 may be in contact with the pad pattern 149. The core insulating pattern 145 may be formed of at least one of silicon oxide, silicon nitride, or silicon oxynitride.

The pad pattern 149 may be disposed on the core insulating pattern 145, and may be in contact with an upper portion of the variable resistive material layer 142. The pad pattern 149 may electrically connect the variable resistive material layer 142 to the bit lines 180. The pad pattern 149 may be formed of doped polysilicon, for example, doped polysilicon having N-type conductivity.

The second separation pattern SS may extend between the first separation patterns MS in the X-direction. The second separation pattern SS may pass through the upper gate electrode 130U, among the gate electrodes 130, in the Z-direction, to separate them from each other in the Y-direction. The number of and/or thicknesses of upper gate electrodes 130U, separated by the second separation pattern SS, may be variously changed in some example embodiments. The upper gate electrodes 130U, separated by the second separation pattern SS, may form different string select lines. The second separation pattern SS may include an insulating material, for example, silicon oxide, silicon nitride, or silicon oxynitride.

The contact plugs 170 may be disposed between the channel structures CH and the bit lines 180. The contact plugs 170 may be respectively connected to the channel pad 149. The contact plugs 170 may be connected to the bit lines 180. The contact plugs 170 may pass through at least one of the upper insulating layers 191 and 192, for example, a first upper insulating layer 191 and a second upper insulating layer 192 in the Z-direction. In some example embodiments, a plurality of studs connected to the contact plugs 170 may be further disposed between one channel structure CH and one bit line 180.

The contact plugs 170 may include a conductive pattern and a barrier layer covering side and bottom surfaces of the conductive pattern. The barrier layer may include, for example, at least one of titanium (Ti), titanium nitride (TiN), tantalum (Ta), or tantalum nitride (TaN). The conductive pattern may include a metal material, for example, at least one of tungsten (W), titanium (Ti), copper (Cu), cobalt (Co), aluminum (Al), or alloys thereof. In some example embodiments, the contact plugs 170 may be formed as a plurality of plug structures.

The bit lines 180 may be disposed on the stacked structure ST and the channel structures CH, and may extend in the Y-direction. The bit lines 180 may be electrically connected to the circuit elements 20 of the first structure 1 through through-contact plugs. The bit lines 180 may be electrically connected to the variable resistive material layer 141.

The bit lines 180 may include a conductive pattern and a barrier layer covering side and bottom surfaces of the conductive pattern. The barrier layer may include, for example, at least one of titanium (Ti), titanium nitride (TiN), tantalum (Ta), or tantalum nitride (TaN). The conductive pattern may include a metal material, for example, at least one of tungsten (W), titanium (Ti), copper (Cu), cobalt (Co), aluminum (Al), or alloys thereof.

The upper insulating layers 191 and 192 may be disposed on the stacked structure ST. The upper insulating layers 191 and 192 may include a first upper insulating layer 191 and a second upper insulating layer 192, sequentially stacked on the stacked structure ST. The upper insulating layers 191 and 192 may be formed of an insulating material such as silicon oxide.

FIGS. 4A to 4D are graphs illustrating an oxygen vacancy concentration in a variable resistive material layer of a semiconductor device according to various example embodiments.

Figure 4A:
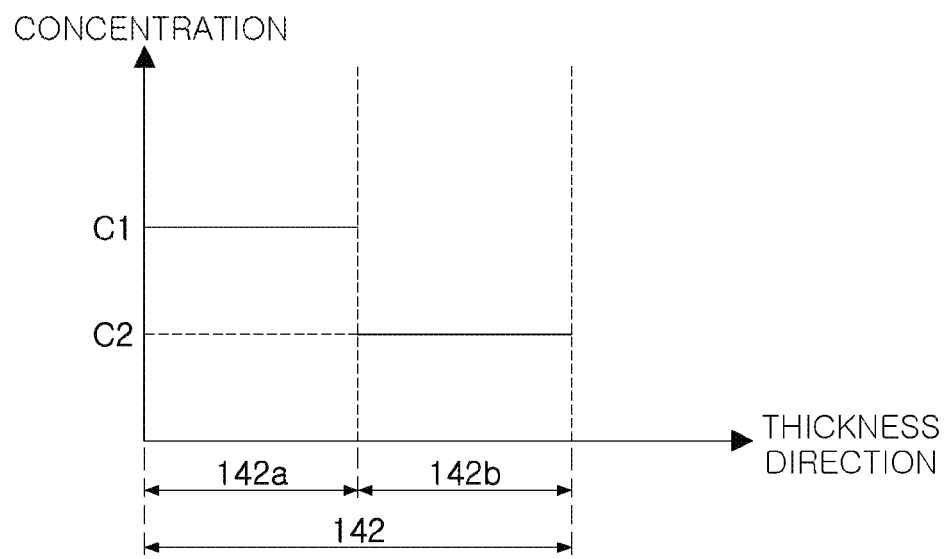
FIGS. 4A to 4D are graphs illustrating an oxygen vacancy concentration in a variable resistive material layer of a semiconductor device according to various example embodiments.

Referring to FIG. 4A, a variable resistive material layer 142 may have an oxygen vacancy concentration varying a concentration in a stepped profile, e.g. in a piecewise linear profile. For example, an oxygen vacancy concentration of the variable resistive material layer 142 in a width direction may decrease in a step profile, in a direction from a gate insulating layer 141 toward a core insulating pattern 145. For example, a channel region 142a of the variable resistive material layer 142 may have an oxygen vacancy at a first concentration C1, and a data storage region 142b of the variable resistive material layer 142 may have an oxygen vacancy at a second concentration C2, lower than the first concentration C1. The first concentration C1 may be a constant concentration according to a change in thickness of the channel region 142a, and the second concentration C2 may be a constant concentration according to a change in thickness of the data storage region 142b.

Figure 4B:
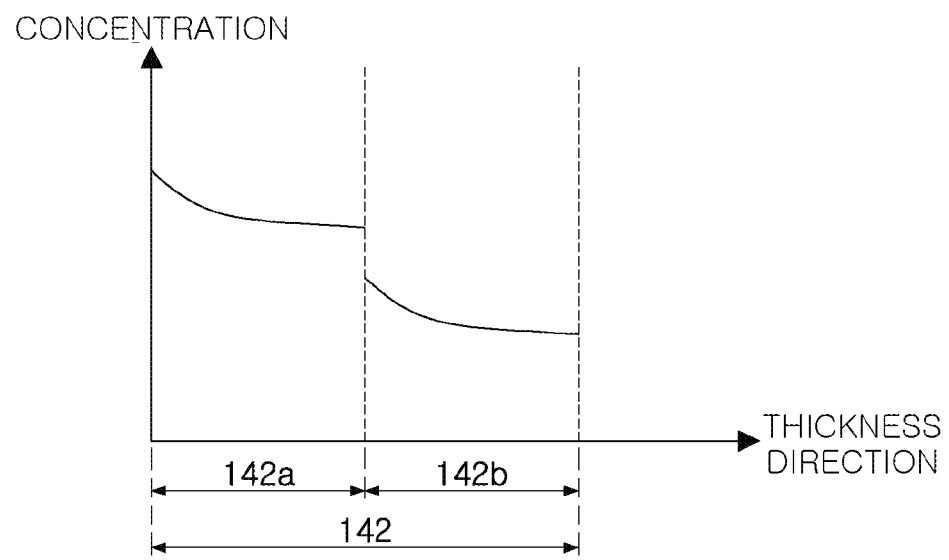
Figure 4C:
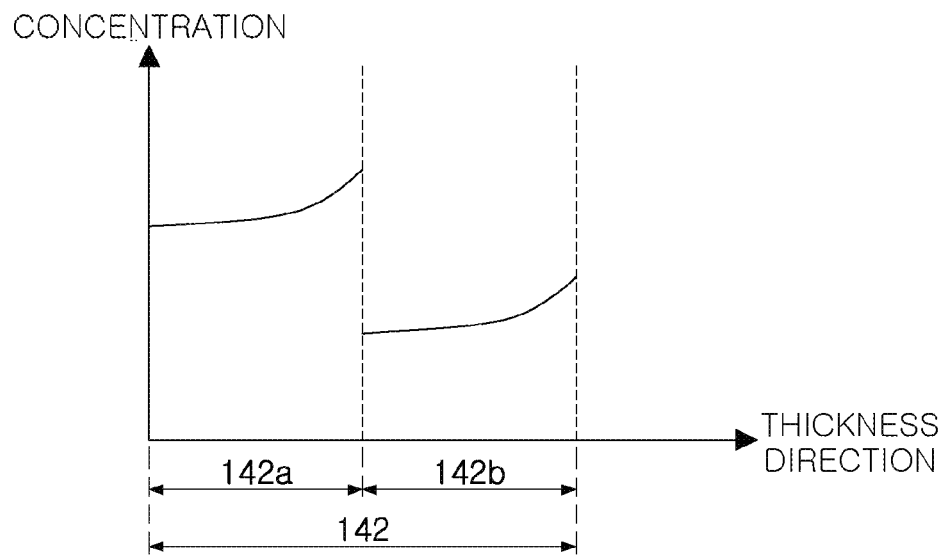

Referring to FIGS. 4B and 4C, a variable resistive material layer 142 may have an oxygen vacancy concentration that gradually changes, e.g. that decreases in a polynomial or exponential manner or a piecewise polynomial or exponential manner, and an oxygen vacancy concentration in a data storage region 142b of the variable resistive material layer 142 may be lower than an oxygen vacancy concentration in a channel region 142a of the variable resistive material layer 142.

Referring to FIG. 4B, for example, the oxygen vacancy concentration in the channel region 142a of the variable resistive material layer 142 may increase as the channel region 142a approaches a gate insulating layer 141, and the oxygen vacancy concentration in the data storage region 142b may decrease as the data storage region 142b approaches a core insulating pattern 145. For example, in the channel region 142a, an oxygen vacancy concentration of a portion of the channel region 142a adjacent to the gate insulating layer 141 may be higher than an oxygen vacancy concentration of a portion of the channel region 142a adjacent to the data storage region 142b. For example, in the data storage region 142b, an oxygen vacancy concentration of a portion of the data storage region 142b adjacent to the channel region 142a may be higher than an oxygen vacancy concentration of a portion of the data storage region 142b adjacent to the core insulating pattern 145.

Referring to FIG. 4C, for example, an oxygen vacancy concentration of a channel region 142a of a variable resistive material layer 142 may decrease as the channel region 142a approaches a gate insulating layer 141, and an oxygen vacancy concentration of the data storage region 142b may increase as the data storage region 142b approaches a core insulating pattern 145. For example, in the channel region 142a, an oxygen vacancy concentration of a portion of the channel region 142a adjacent to the gate insulating layer 141 may be higher than an oxygen vacancy concentration of a portion of the channel region 142a adjacent to the data storage region 142b. For example, in the data storage region 142b, an oxygen vacancy concentration of a portion of the data storage region 142b adjacent to the channel region 142a may be lower than an oxygen vacancy concentration of a portion the data storage region 142b adjacent to the core insulating pattern 145.

Figure 4D:
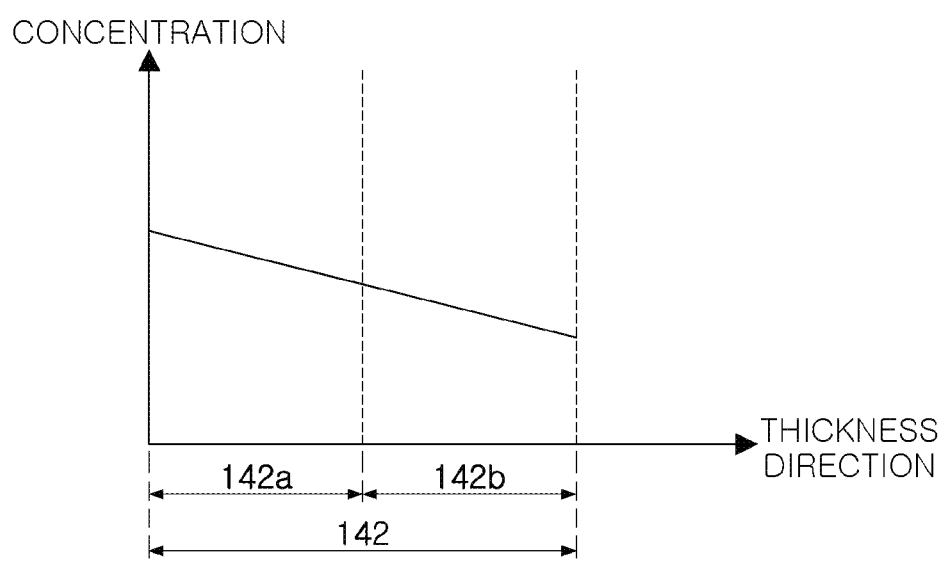

Referring to FIG. 4D, a variable resistive material layer 142 may have an oxygen vacancy concentration that constantly changes. For example, in the variable resistive material layer 142, the oxygen vacancy concentration may gradually decrease from a channel region 142a to a data storage region 142b. Therefore, the data storage region 142b may have a lower oxygen vacancy concentration, compared to the channel region 142a.

Figure 5A:
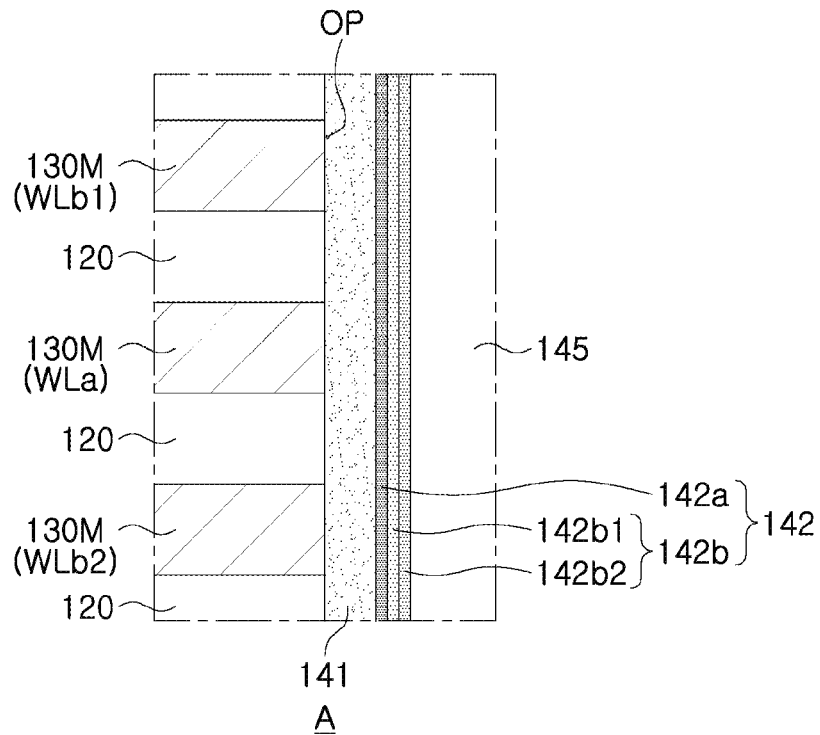
FIG. 5A is a partially enlarged view of a portion of a semiconductor device according to various example embodiments.

FIG. 5A is a partially enlarged view of a portion of a semiconductor device according to various example embodiments.

Figure 5B:
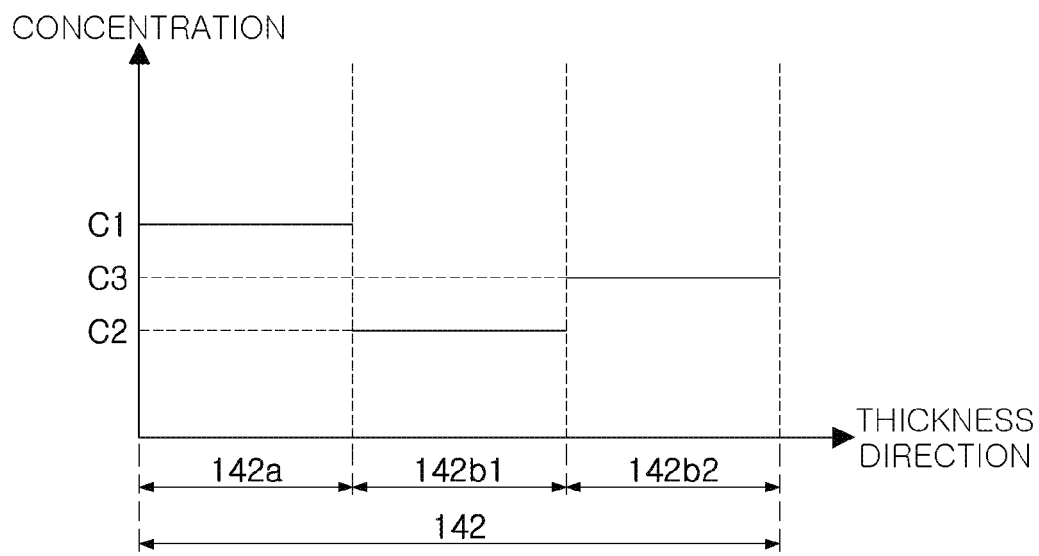
FIG. 5B is a graph illustrating an oxygen vacancy concentration in a variable resistive material layer of a semiconductor device according to various example embodiments.

FIG. 5B is a graph illustrating an oxygen vacancy concentration in a variable resistive material layer of a semiconductor device according to various example embodiments.

Referring to FIGS. 5A and 5B, a data storage region 142b of a variable resistive material layer 142 may include a first data storage region 142b1 adjacent to a channel region 142a and a second data storage regions 142b2 adjacent to a core insulating pattern 145. The first data storage region 142b1 may have oxygen vacancies at a second concentration C2, lower than a first concentration C1 of the channel region 142a, and the second data storage region 142b2 may have oxygen vacancies at a third concentration C3, lower than the first concentration C1 and higher than the second concentration C2. In FIG. 5B, the variable resistive material layer 142 is illustrated as having an oxygen vacancy concentration varying a concentration in a stepped profile, but the variable resistance layer 142 may have an oxygen vacancy concentration that gradually changes, as illustrated in FIGS. 4B and 4C, or may have an oxygen vacancy concentration that constantly changes, as illustrated in FIG. 4D.

Figure 6A:
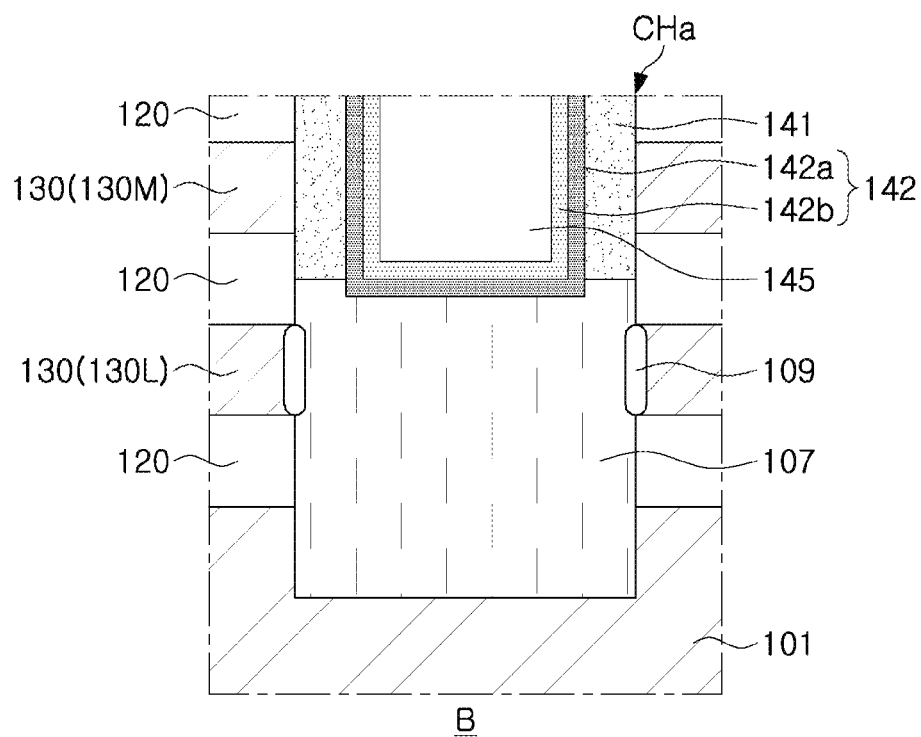
FIGS. 6A and 6B are partially enlarged views illustrating a portion of a semiconductor device according to various example embodiments.
Figure 6B:
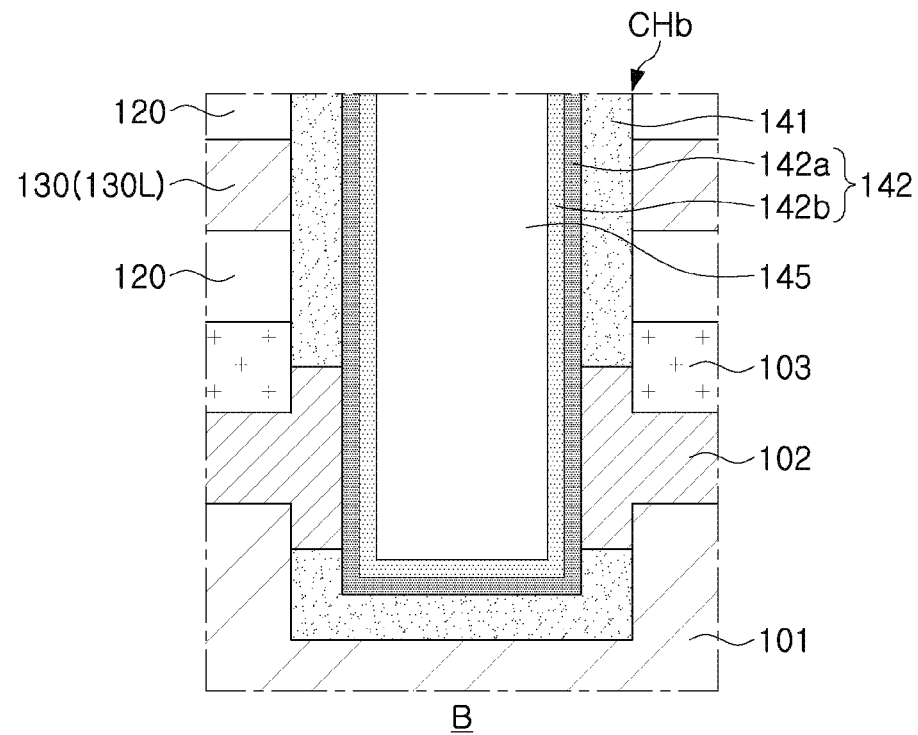

FIGS. 6A and 6B are partially enlarged views illustrating a portion of a semiconductor device according to various example embodiments. FIGS. 6A and 6B illustrate a region corresponding to a region indicated by portion 'B' of FIG. 2.

Referring to FIG. 6A, a channel structure CHa may further include an epitaxial layer 107. The epitaxial layer 107 may be disposed to contact an upper substrate 101 on a lower end of the channel structure Cha, and may be disposed adjacent to a side surface of at least one gate electrode 130. The epitaxial layer 107 may be disposed in a recessed region of the upper substrate 101. An upper surface of the epitaxial layer 107 may be higher than an upper surface of a lower gate electrode 130L, and may be lower than the lower surface of a gate electrode 130 on the lower gate electrode 130L, but the present inventive concept is not limited thereto. The epitaxial layer 107 may be connected to a variable resistive material layer 142 through the upper surface of the epitaxial layer 107. An insulating layer 109 may be further disposed between the epitaxial layer 107 and the lower gate electrode 130L adjacent to the epitaxial layer 107.

Referring to FIG. 6B, a semiconductor device 100 may further include a first horizontal conductive layer 102 disposed along an upper surface of an upper substrate 101 and a second horizontal conductive layer 103 extending along an upper surface of the first horizontal conductive layer 102. The first horizontal conductive layer 102 and the second horizontal conductive layer 103 may be disposed between the upper substrate 101 and a stacked structure ST. At least a portion of the first horizontal conductive layer 102 and at least a portion of the second horizontal conductive layer 103 may be formed of polysilicon having N-type conductivity. The first horizontal conductive layer 102 may pass through a gate insulating layer 141 below a channel structure CHb, and may be in contact with a side surface of a variable resistive material layer 142.

Figure 7:
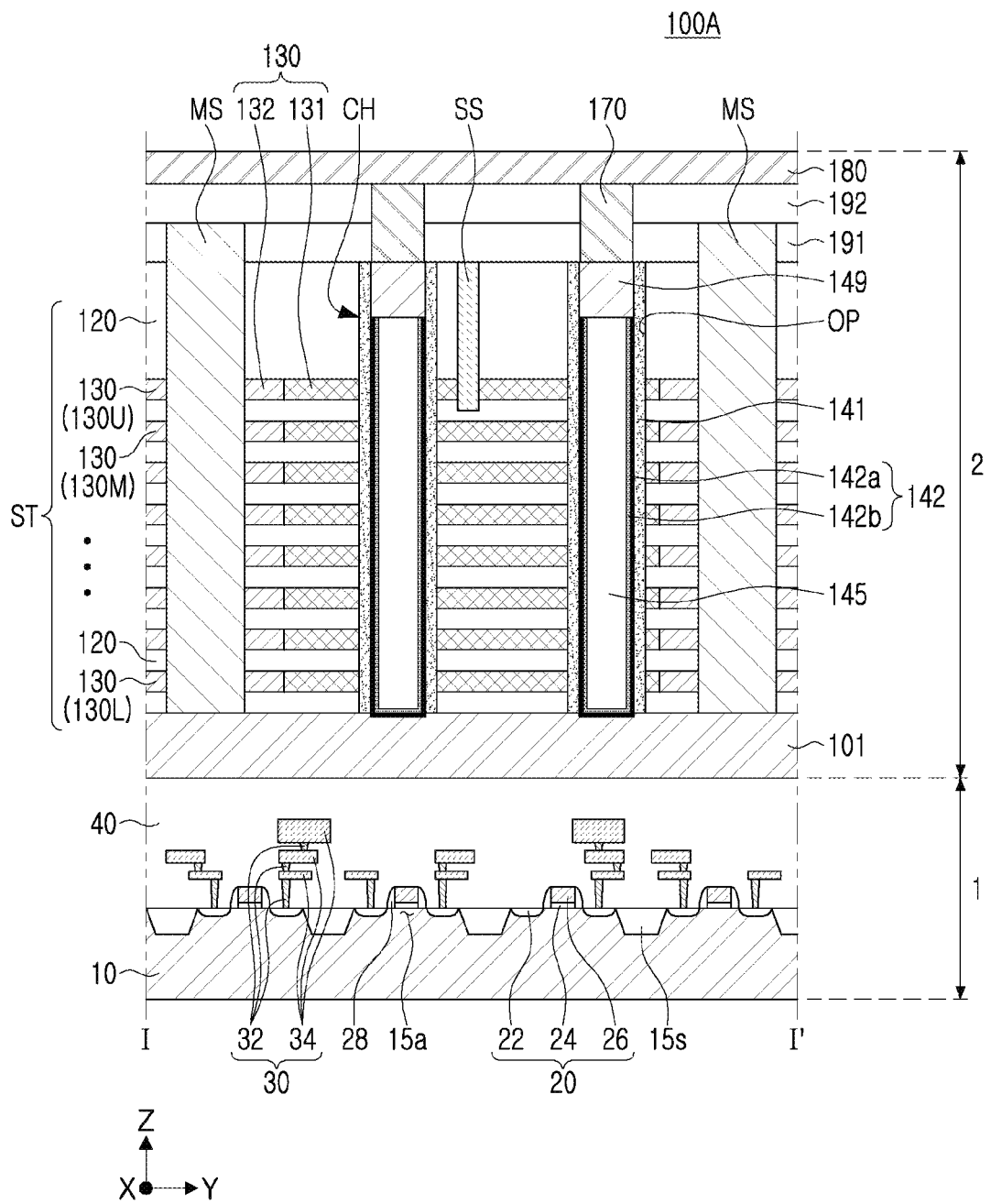
FIGS. 7 to 9 are schematic cross-sectional views of a semiconductor device according to various example embodiments.
Figure 8:
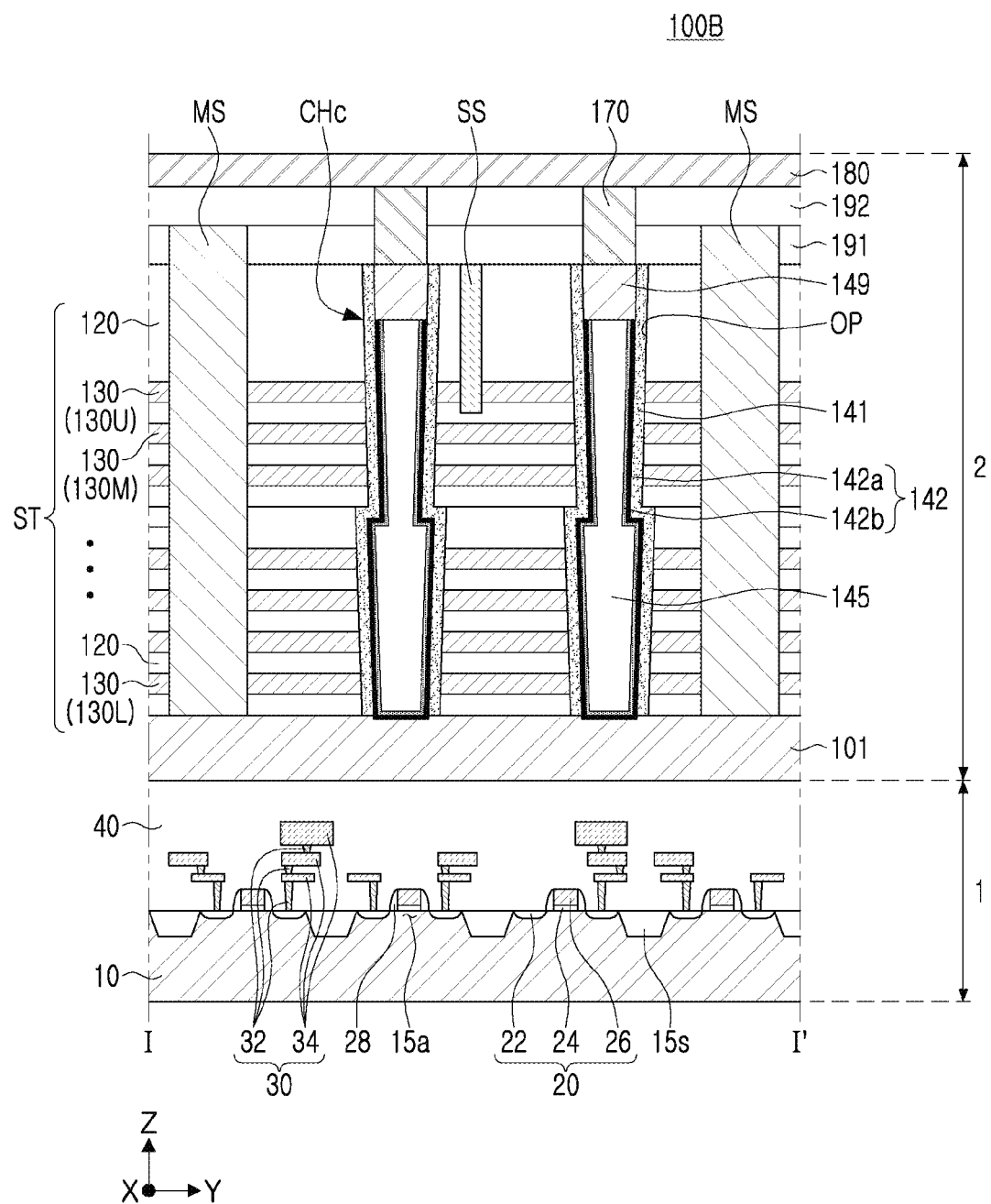
Figure 9:
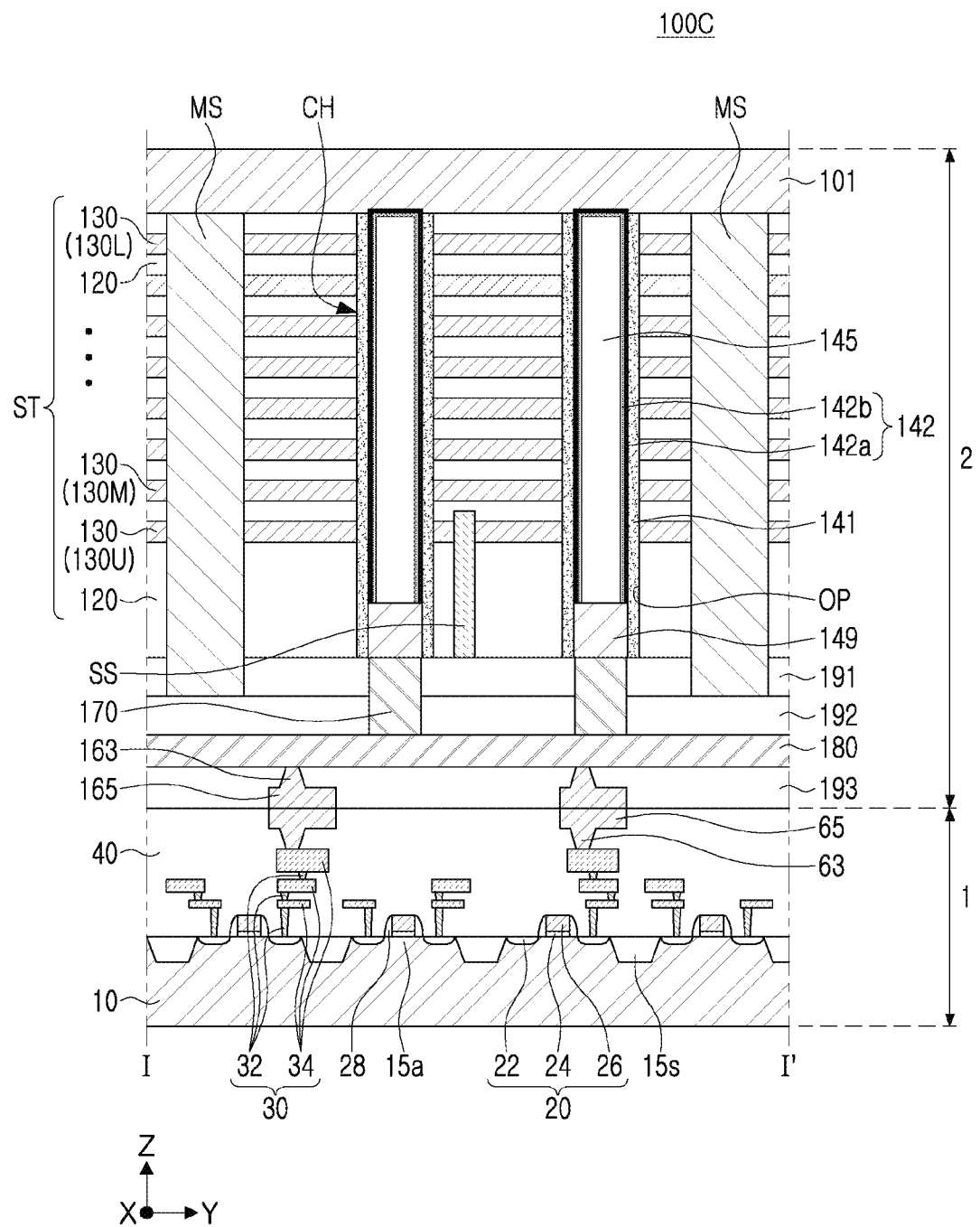

FIGS. 7 to 9 are schematic cross-sectional views of a semiconductor device according to various example embodiments.

Referring to FIG. 7, gate electrodes 130 of a semiconductor device 100A may include a first gate portion 131 adjacent to channel structures CH and a second gate portion 132 adjacent to first isolation patterns MS, respectively. The first gate portion 131 may surround side surfaces of the channel structures CH.

The first gate portion 131 may be formed of doped polysilicon, and the second gate portion 132 may be formed of a metal-semiconductor compound (e.g., one or more of WSi, TiSi, or the like), a metal nitride (e.g., WN, TiN, or the like), and/or a metal (e.g., W or the like).

Each of the gate electrodes 130 may include the first and second gate portions 131 and 132, to improve electrical characteristics of the gate electrodes 130. Therefore, in some example embodiments, a semiconductor device having improved electrical characteristics may be provided.

Referring to FIG. 8, in a semiconductor device 100B, a stacked structure ST of a second structure 2 may include a lower stacked structure and an upper stacked structure on the lower stacked structure, and channel structures CHc may include a lower channel structure passing through the lower stacked structure and an upper channel structure passing through the upper stacked structure, respectively. A variable resistive material layer 142 of the first channel structure and a variable resistive material layer 142 of the second channel structure may be connected to each other. In the connection region, a gate insulating layer 141 and a variable resistive material layer 142 may be respectively bent. For example, a side surface of the variable resistive material layer 142 may include a bent portion due to a difference in width in the connection region, and a side slope may be changed. Example embodiments a case in which a stacked structure is a double stacked structure, and inventive concepts may also include a multi-stacked structure that may be a double or more stacked structure. Furthermore a number of gate electrodes 130 below the bent portion may be the same as, or greater than, or less than a number of gate electrodes above the bent portion.

Referring to FIG. 9, a first structure 1 and a second structure 2 of a semiconductor device 100C may be bonded to each other through a bonding structure without a further adhesive layer. The second structure 2 of the semiconductor device 100C is illustrated as vertically inverting the second structure 2 of the semiconductor device 100 of FIG. 2. The semiconductor device 100C may further include an upper bonding pad 165 and a lower bonding pad 65. The second structure 2 may further include a third upper insulating layer 193. The upper bonding pad 165 may be electrically connected to a bit line 180 through an upper bonding via 163, and the lower bonding pad 65 may be electrically connected to circuit elements 20 through a lower via 63. The lower bonding pad 65 and the upper bonding pad 165 may include, for example, tungsten (W), aluminum (Al), copper (Cu), tungsten nitride (WN), tantalum nitride (TaN), or titanium nitride (TiN), or a combination thereof, respectively. The lower bonding pad 65 and the upper bonding pad 165 may function as bonding layers for bonding the first structure 1 and the second structure 2. In addition, the lower bonding pad 65 and the upper bonding pad 165 may provide an electrical connection path between the first structure 1 and the second structure 2. The lower bonding pad 65 and the upper bonding pad 165 may be bonded by copper(Cu)-to-copper(Cu) bonding. Alternatively or in addition to the copper-to-copper bonding, the first structure 1 and the second structure 2 may be bonded by dielectric-to-dielectric bonding. The dielectric-to-dielectric bonding may form, for example, a portion of each of the third upper insulating layer 193 and a lower insulating layer 40, and may be a bonding by dielectric layers surrounding the upper bonding pad 165 and the lower bonding pad 65.

FIGS. 10A to 11B are flowcharts illustrating a method of manufacturing a semiconductor device according to various example embodiments.

FIGS. 12 to 23 are schematic views illustrating a method of manufacturing a semiconductor device according to various example embodiments.

Figure 10A:
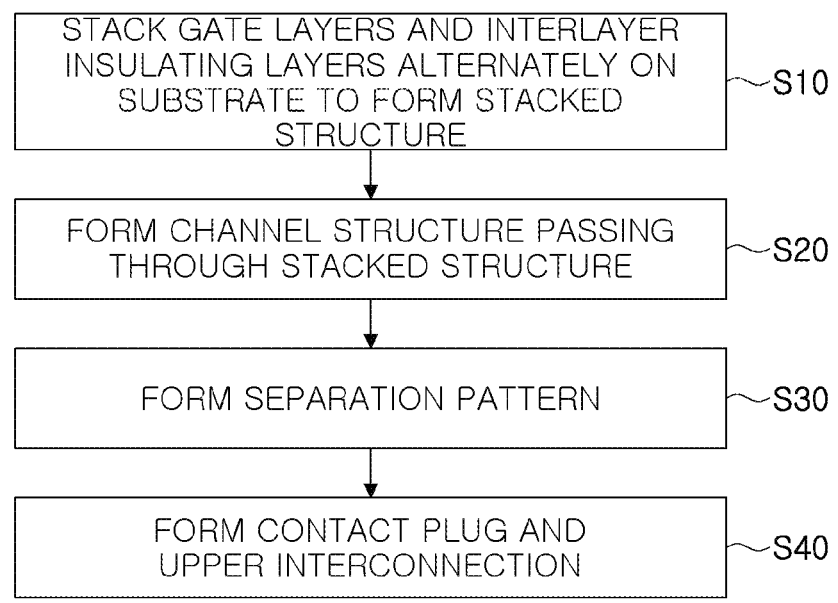
FIGS. 10A to 10B, and FIGS. 11A to 11B are flowcharts illustrating a method of manufacturing a semiconductor device according to various example embodiments.
Figure 10B:
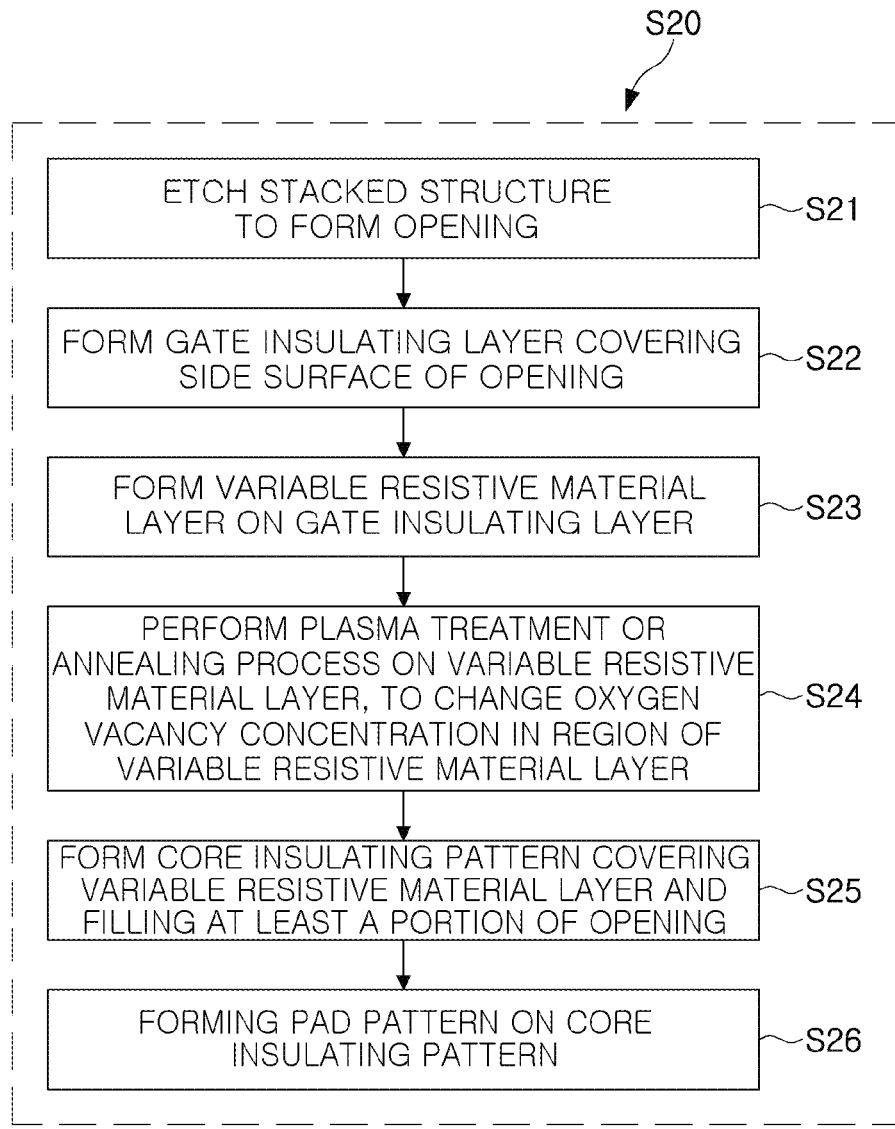
Figure 11A:
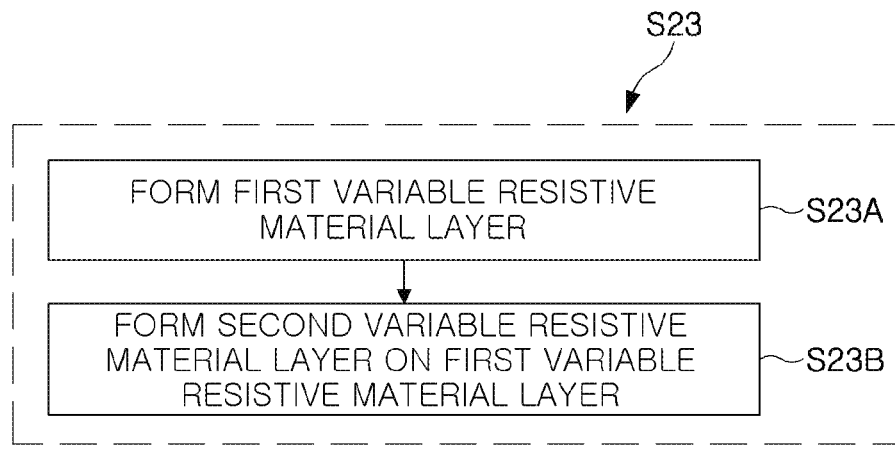
Figure 11B:
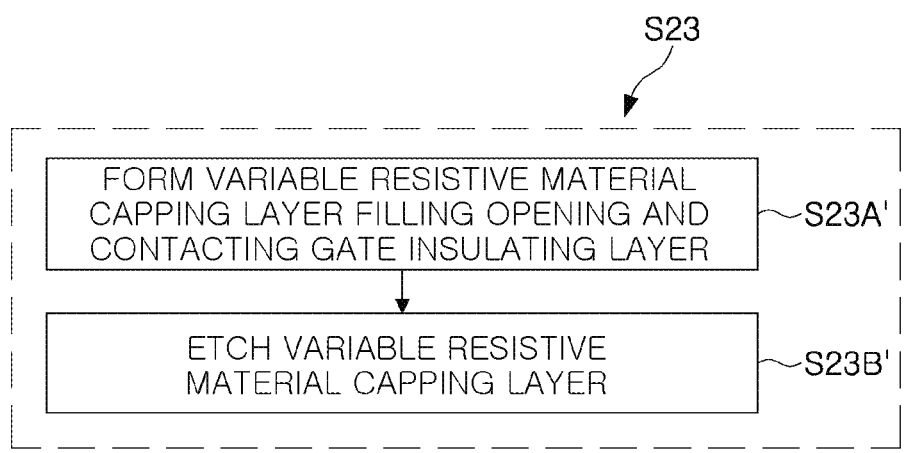
Figure 12:
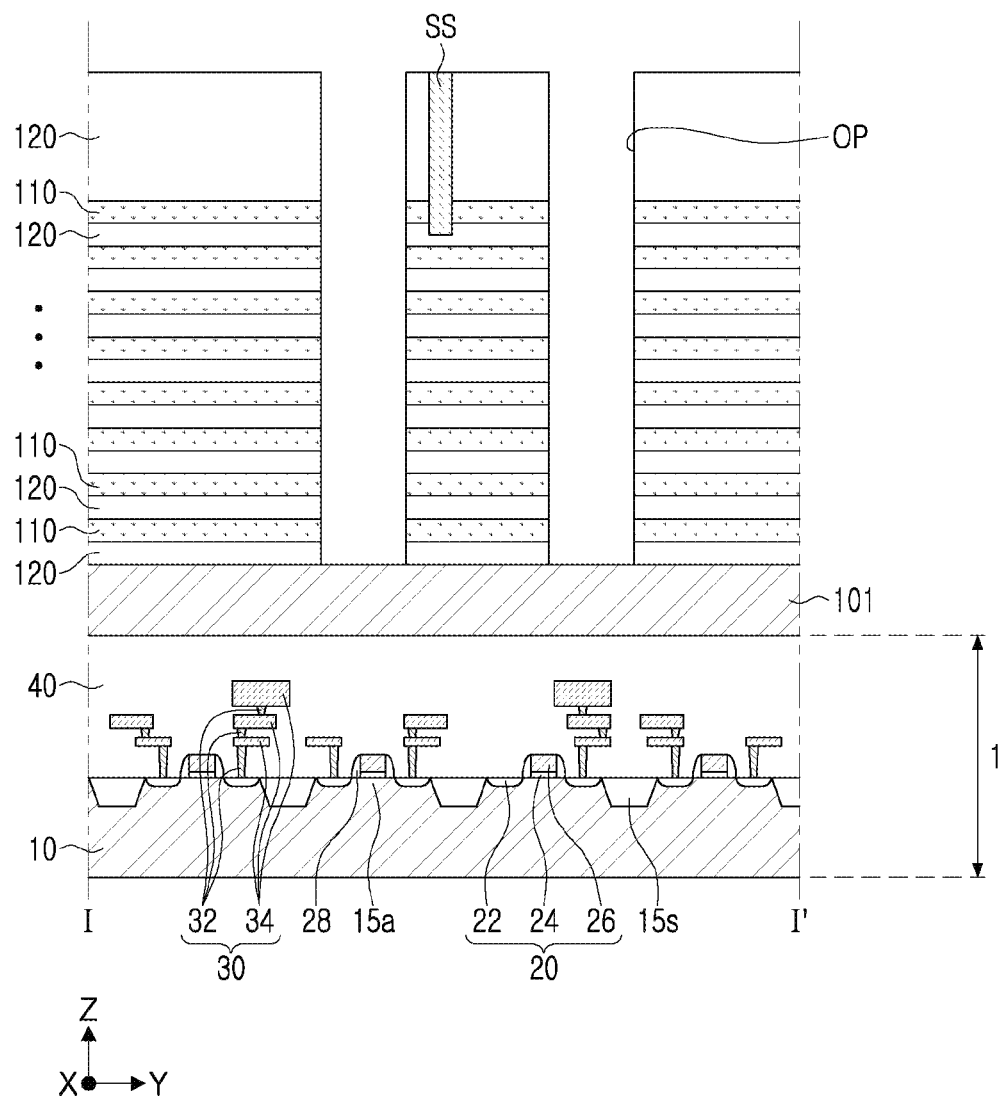
FIGS. 12, FIGS. 13A to 13B, and FIGS. 14-23 are schematic views illustrating a method of manufacturing a semiconductor device according to various example embodiments.

Referring to FIGS. 10A, 10B, and 12, a first structure 1 including circuit elements 20 and a lower interconnection structure 30 may be formed on a lower substrate 10, an upper substrate 101 may be formed on the first structure 1, sacrificial layers 110 and interlayer insulating layers 120 may be alternately stacked on the upper substrate 101 (S10), and openings OP passing through the sacrificial layers 110 and the interlayer insulating layers 120 may be formed (S21).

First, device isolation layers 15s may be formed in a lower substrate 10, and a circuit gate dielectric layer 24 and a circuit gate electrode 26 may be sequentially formed on an active region 15a. The device isolation layers 15s may be formed by, for example, a shallow trench isolation (STI) process. The circuit gate dielectric layer 24 may be formed of silicon oxide, and the circuit gate electrode 26 may be formed as at least one of a polysilicon layer or a metal-semiconductor compound layer, but is not limited thereto. Next, a spacer layer 28 may be formed on both sidewalls of the circuit gate dielectric layer 24 and both sidewalls of the circuit gate electrode 26, and source/drain regions 22 may be formed in the active region 15a. In some example embodiments, the spacer layer 28 may be formed as a plurality of layers. The source/drain regions 22 may be formed by performing an ion implantation process and/or an in-situ dopant deposition process; however, example embodiments are not limited thereto.

Lower contacts 32 and lower interconnections 34 of the lower interconnection structure 30 may be formed by partially forming a lower insulating layer 40, etching and removing a portion thereof, and filling a conductive material therein, or may be formed by depositing a conductive material, patterning the same, and filling a portion removed by the patterning with a portion of a lower insulating layer 40.

The lower insulating layer 40 may be formed as a plurality of insulating layers. The lower insulating layer 40 may be partially formed in each operation of forming the lower interconnection structure 30, and may be further partially formed on an uppermost lower interconnection 34, to be finally prepared to cover the circuit elements 20 and the lower interconnection structure 30.

The upper substrate 101 may be formed of, for example, polysilicon. Polysilicon constituting the upper substrate 101 may include impurities, which may be implanted and/or may be incorporated during deposition of the polysilicon.

The sacrificial layers 110 may be partially replaced by a gate electrodes 130 (refer to FIG. 2) by a subsequent process. The sacrificial layers 110 may be formed of a material, different from that of the interlayer insulating layers 120, and may be formed of a material that may be etched with etching selectivity for the interlayer insulating layers 120 under specific etching conditions. For example, the interlayer insulating layer 120 may be formed of at least one of silicon oxide or silicon nitride, and the sacrificial layers 110 may be formed of a material, different from that of the interlayer insulating layer 120, selected from silicon, silicon oxide, silicon carbide, and silicon nitride.

The sacrificial layer 110 may be referred to as a 'gate layer,' and when the sacrificial layer 110 includes polysilicon, the gate layer including polysilicon may function as a gate electrode, and a process of replacing the sacrificial layer 110 with a subsequent gate electrode 130 may be omitted. In some example embodiments, thicknesses of the interlayer insulating layers 120 may not all be the same. Thicknesses of the interlayer insulating layers 120 and the sacrificial layers 110 and/or the number of layers constituting the interlayer insulating layers 120 and the sacrificial layers 110 may be variously changed from those illustrated. A preliminary stacked structure may be formed by stacking the sacrificial layers 110 and the interlayer insulating layers 120. After the preliminary stacked structure is formed, second separation patterns MS2 passing through a portion of upper sacrificial layers 110, among the sacrificial layers 110, may be formed.

Openings OP may be formed by anisotropically etching the preliminary stacked structure. Due to a height of the preliminary stacked structure, side surfaces of the openings OP may be inclined with respect to an upper surface of the upper substrate 101.

Referring to FIGS. 10B, 11A, 13A, and 14, a gate insulating layer 141 covering the side surfaces of the openings OP may be formed (S22), and a variable resistive material layer 142P may be formed. (S23), and the forming a variable resistive material layer 142P (S23) may include forming a first variable resistive material layer 142_1 (S23A) and forming a second variable resistive material layer 142_2 on the first variable resistive material layer 142_1 (S23B).

The gate insulating layer 141 may be formed to conformally cover side and lower surfaces of the openings OP. The gate insulating layer 141 may be partially formed even on a level higher than an uppermost interlayer insulating layer 120. After partially opening a lower portion of the gate insulating layer 141, the first variable resistive material layer 142_1 and the second variable resistive material layer 142_2 may be conformally formed. The first variable resistive material layer 142_1 may be in contact with the upper substrate 101, and may be in contact with the gate insulating layer 141. The first variable resistive material layer 142_1 and the second variable resistive material layer 142_2 may be formed of the same material, and may be formed by, for example, performing an atomic layer deposition (ALD) process. The first variable resistive material layer 142_1 and the second variable resistive material layer 142_2 may be formed, for example, at the same time and/or in the same process chamber; however, example embodiments are not limited thereto. Although the first variable resistive material layer 141_1 and the second variable resistive material layer 142_2 are illustrated as respective layers for convenience of description, but may be substantially formed as a single layer (142P).

Referring to FIGS. 10B, 11B, 13B, and 14, a gate insulating layer 141 covering the side surfaces of the openings OP may be formed (S22), and a variable resistive material layer 142P may be formed. (S23), and the forming a variable resistive material layer 142P (S23) may include forming a variable resistive material capping layer 142' filling the opening OP and contacting the gate insulating layer 141 (S23A'), and etching the variable resistive material capping layer 142' (S23 B'). The gate insulating layer 141 may be formed to conformally cover side and lower surfaces of the openings OP. The gate insulating layer 141 may be partially formed even on a level higher than an uppermost interlayer insulating layer 120. After partially opening a lower portion of the gate insulating layer 141, for example, a chemical vapor deposition (CVD) process or a sputtering process may be performed to form the variable resistive material capping layer 142'. The variable resistive material capping layer 142' may fill the opening OP, and may be in contact with the gate insulating layer 141 in the opening OP. A central region of the variable resistive material capping layer 142' may be etched, to form the variable resistive material layer 142P extending along a side surface of the gate insulating layer 141 and having a specific thickness from the side surface of the gate insulating layer 141. The specific thickness may be predetermined, or alternatively may be dynamically or variably determined.

Figure 13A:
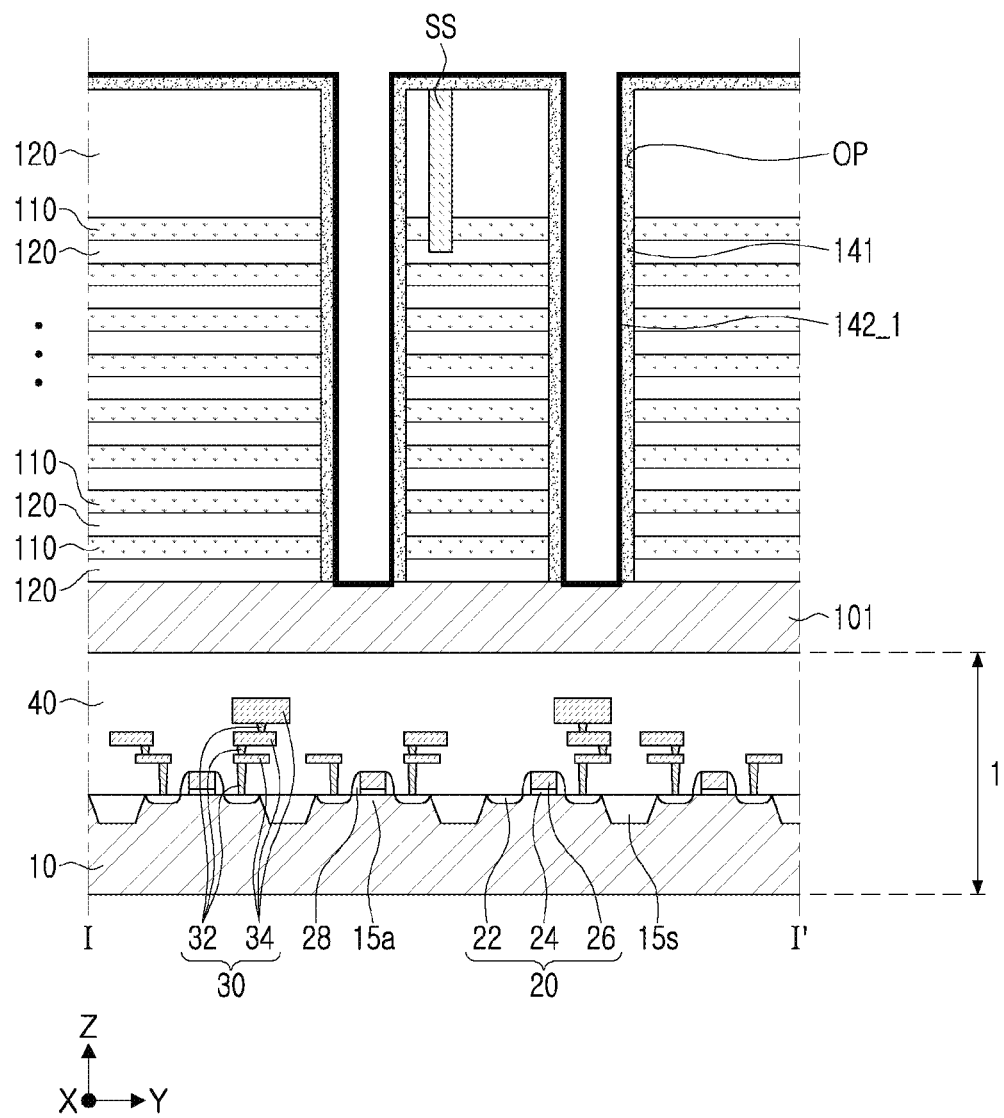
Figure 13B:
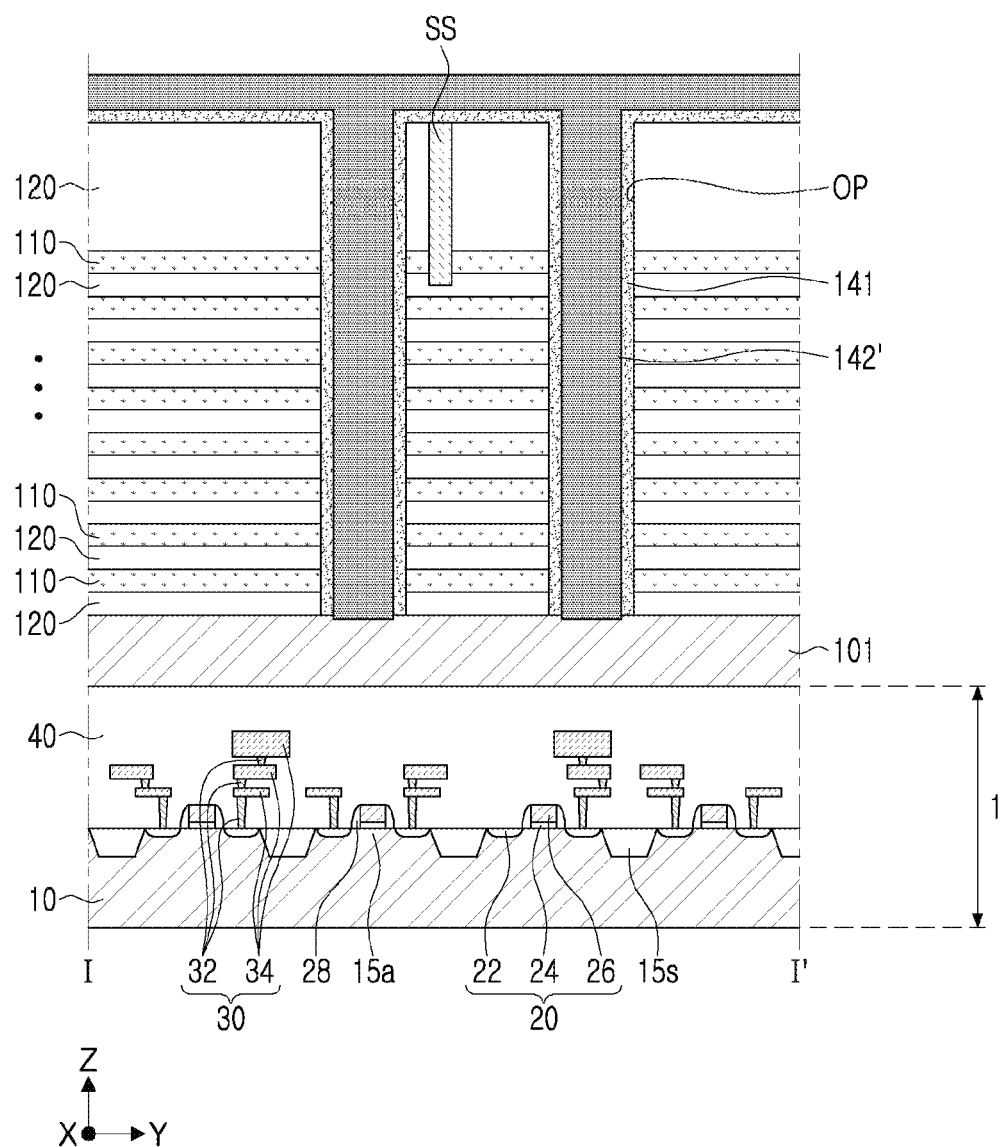
Figure 14:
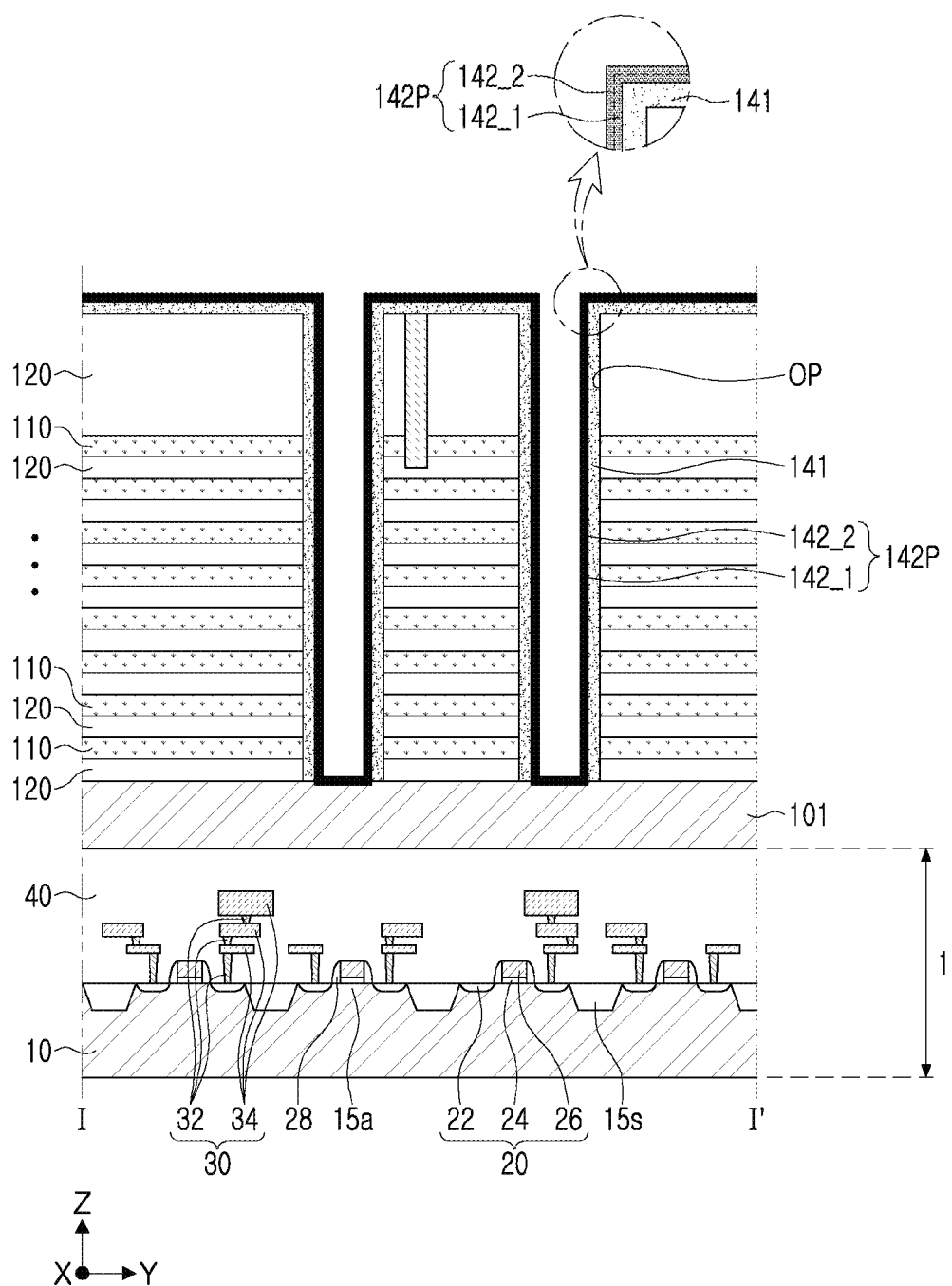
Figure 15:
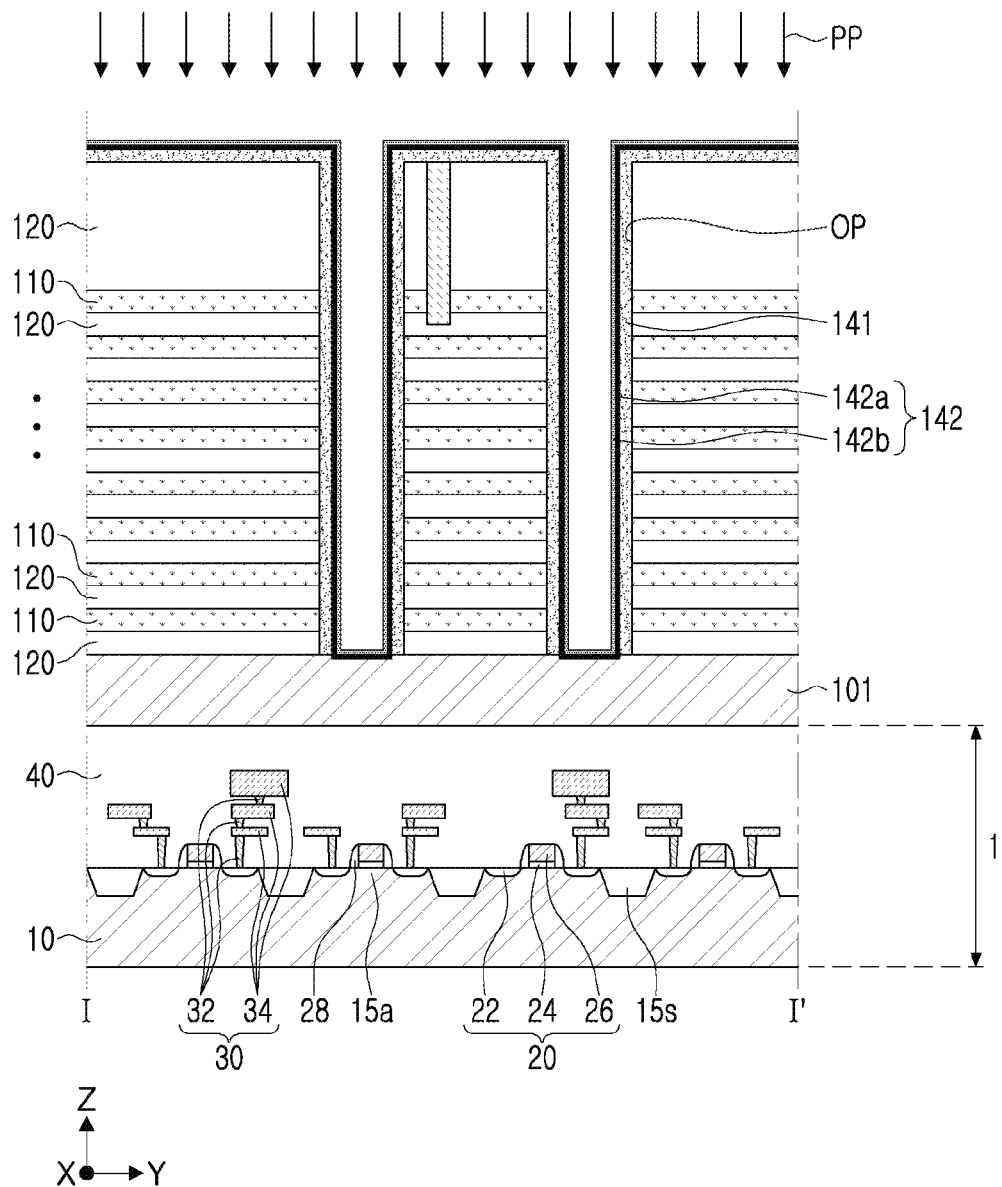
Figure 16:
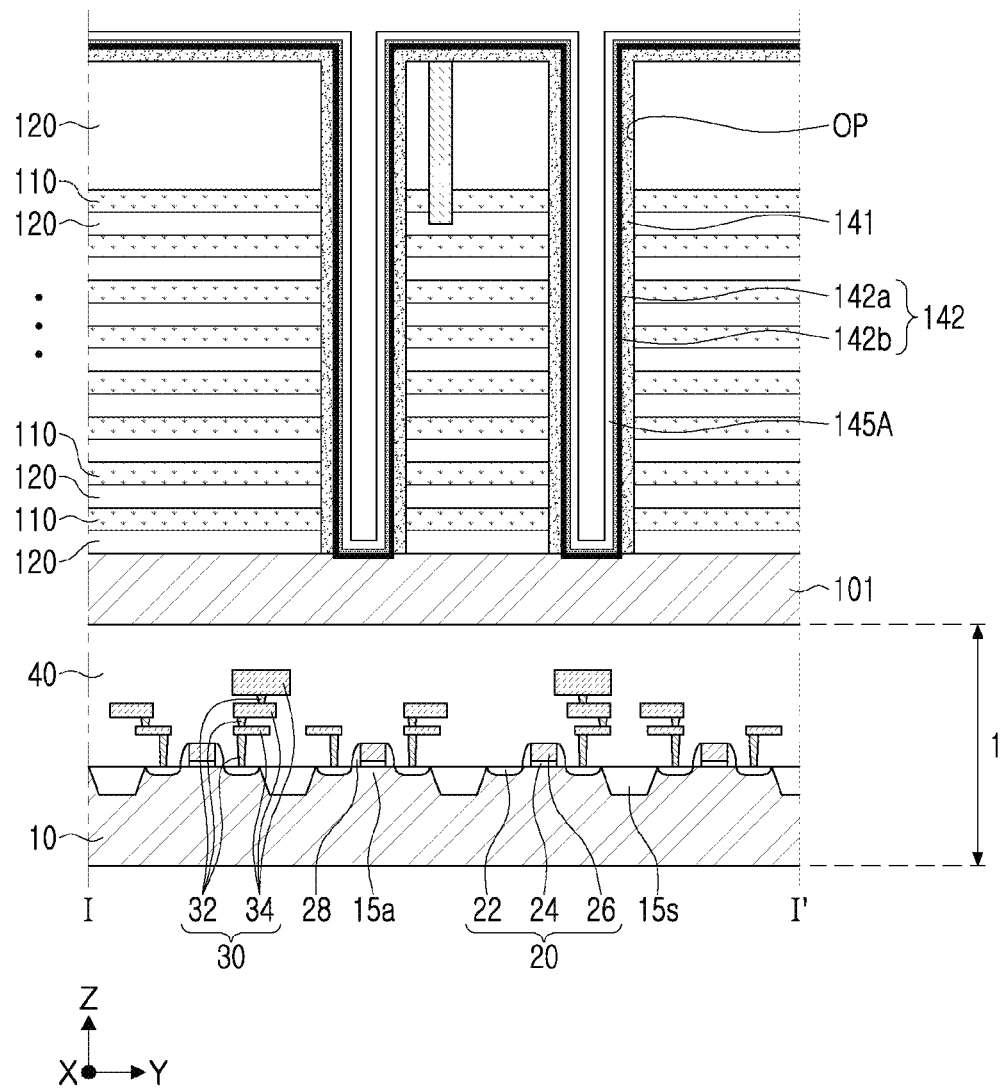
Figure 17:
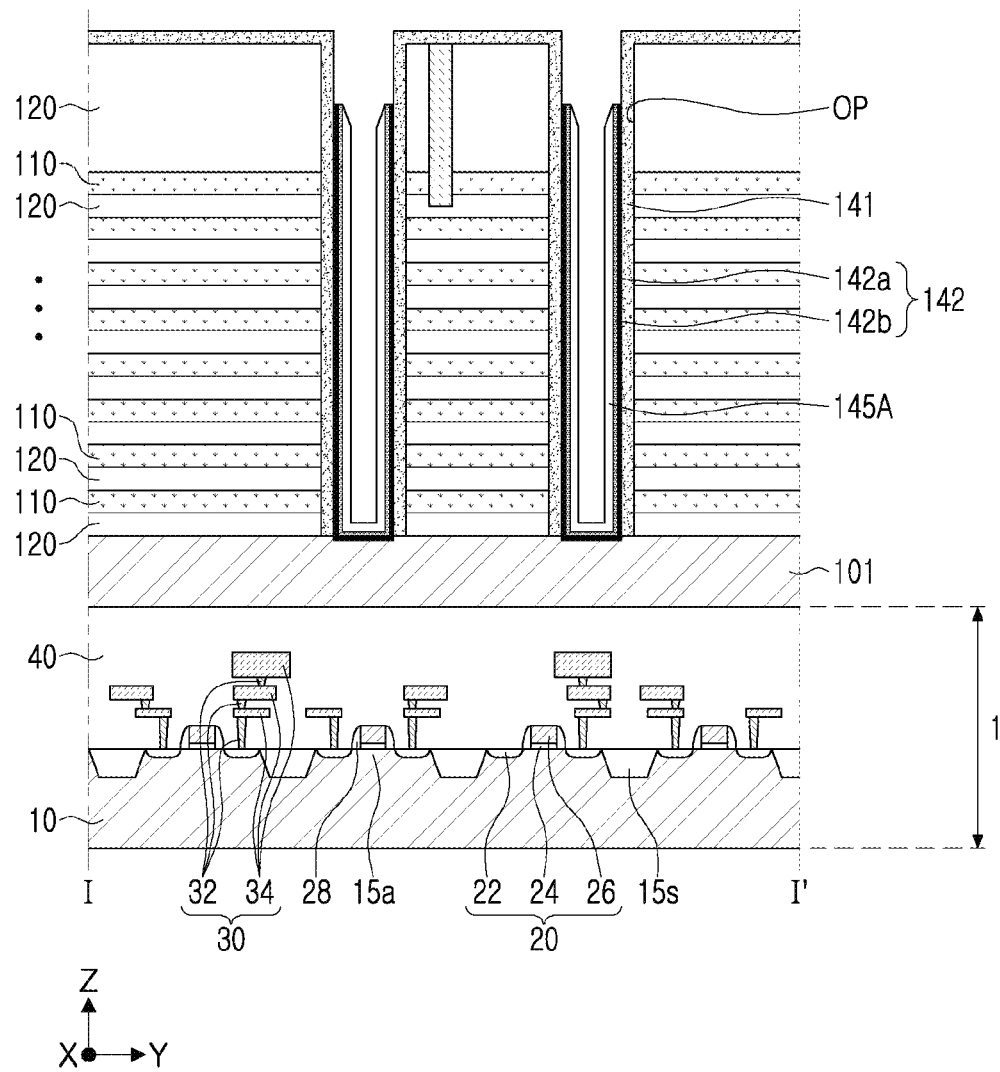
Figure 18:
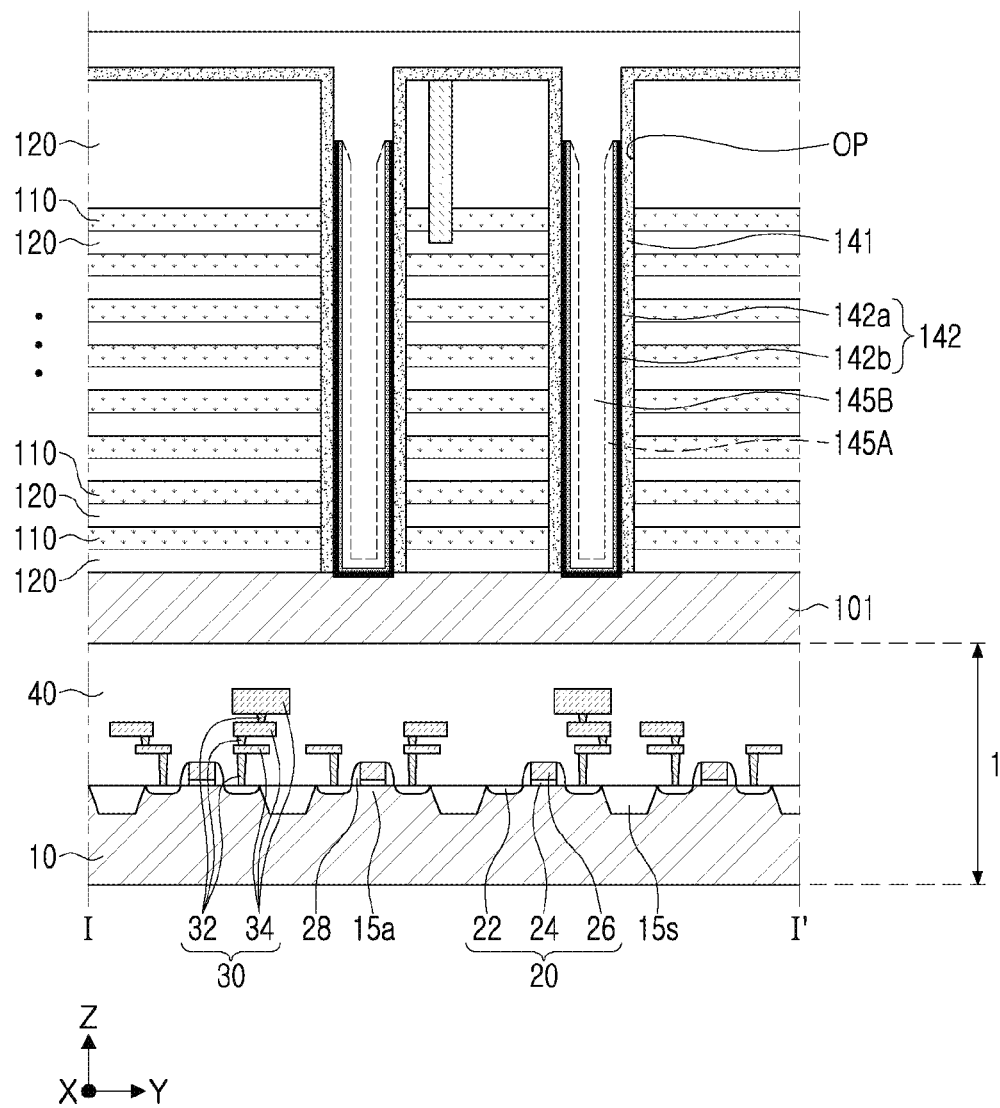
Figure 19:
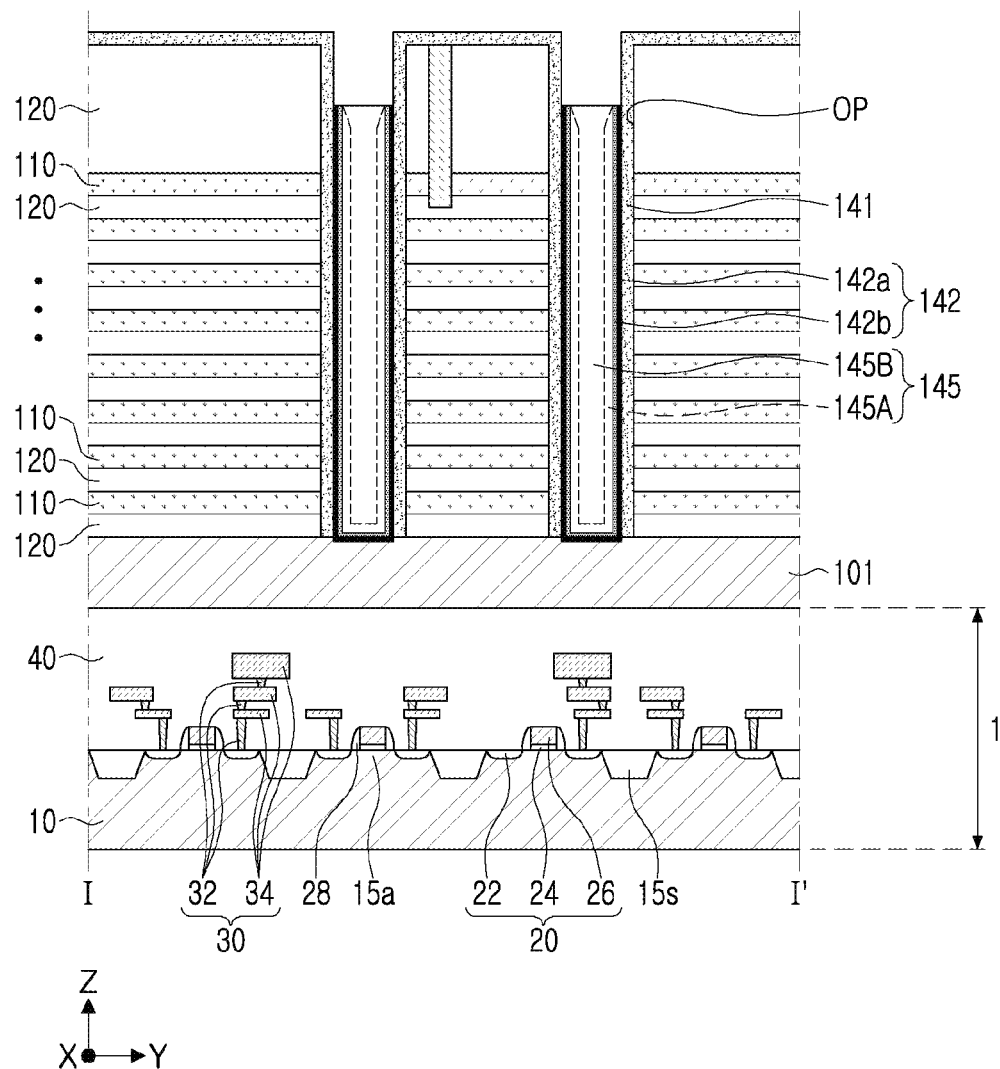
Figure 20:
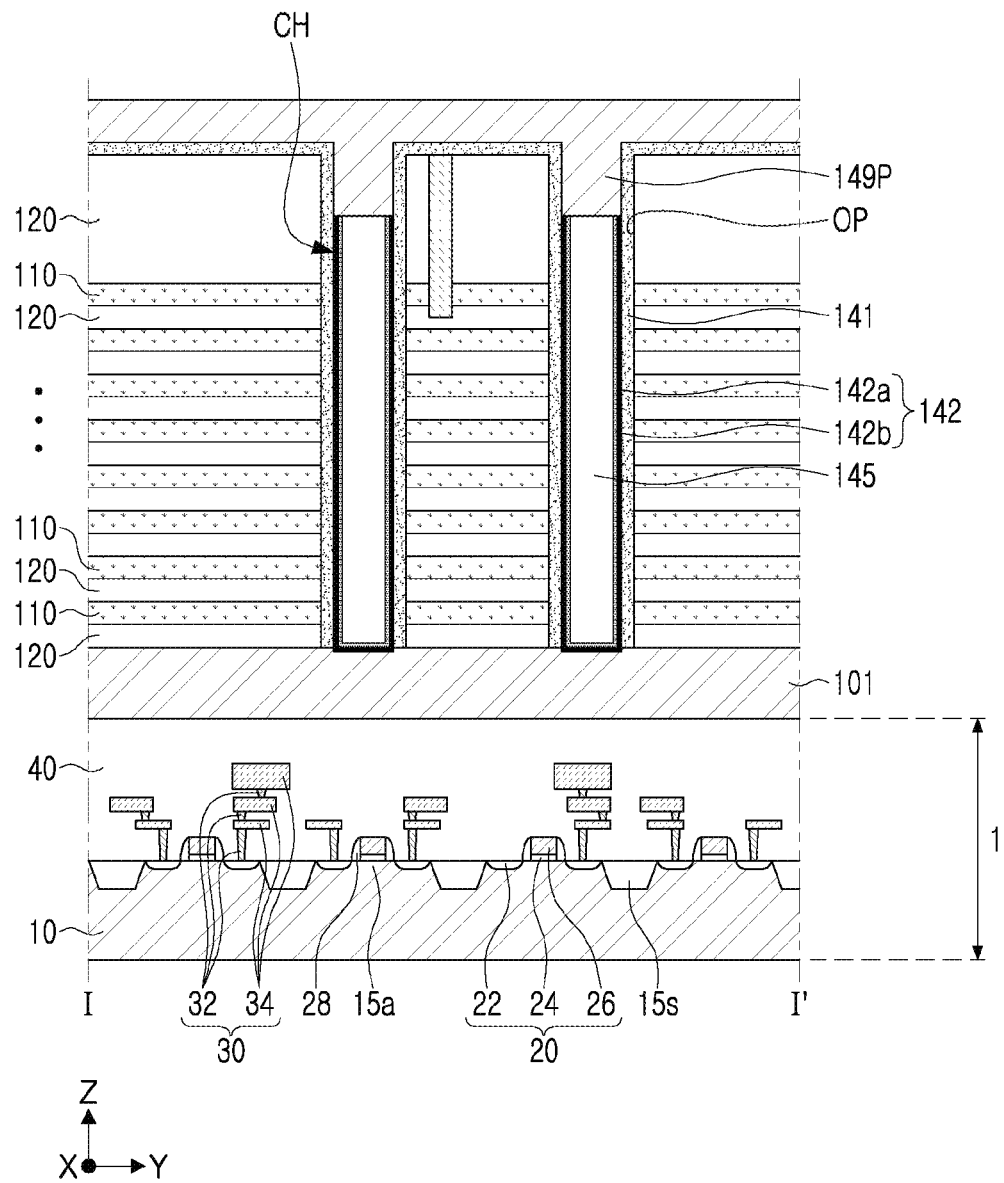
Figure 21:
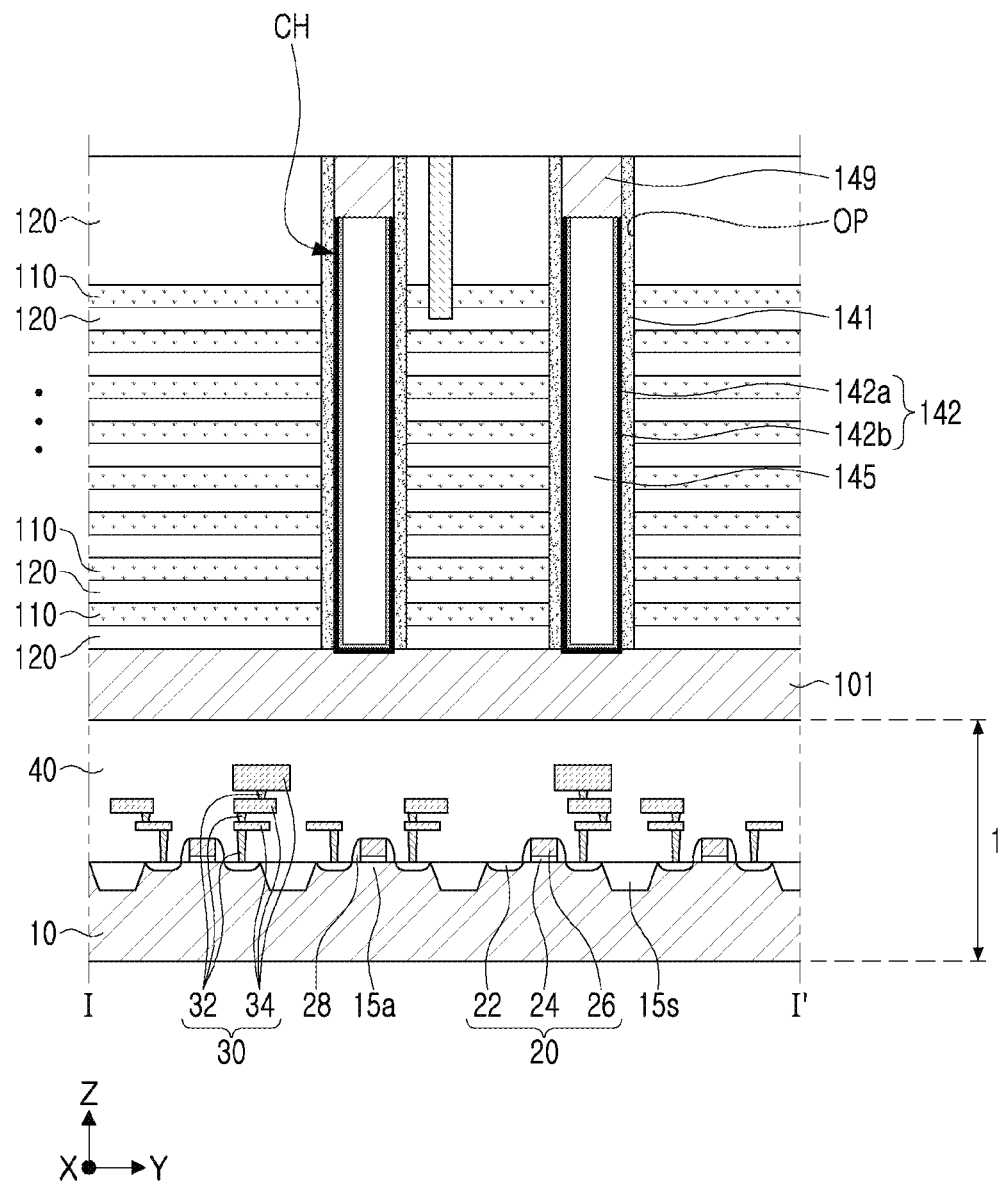

As in FIG. 13A-14, a method of forming the variable resistive material layer 142P before performing the following post-processing process, as described above, may include the manufacturing processes of FIGS. 13A and 14, or may include the manufacturing processes FIGS. 13B and 14.

Referring to FIGS. 10B and 14, a plasma treatment process PP may be performed on the variable resistive material layer 142P to change an oxygen vacancy concentration in a portion of the variable resistive material layer 142P (S24), to form a variable resistive material layer 142 including a channel region 142a and a data storage region 142b. The plasma treatment process PP may be performed using a source gas including one or more of oxygen ($O_2$), hydrogen ($H_2$), silane ($SiH_4$), argon (Ar), or the like. For example, a plasma treatment process PP using argon (Ar) may be performed, which may reduce an oxygen vacancy concentration in a portion of a surface of the variable resistive material layer 142P. Through this, a structure in which an oxygen vacancy concentration in the channel region 142a is relatively lower than an oxygen vacancy concentration in the data storage region 142b may be formed.

For example, an annealing process may be performed, instead of or in addition to the plasma processing process PP, to change an oxygen vacancy concentration in a portion of the variable resistive material layer 142P. For example, an annealing process may be performed to reduce an oxygen vacancy concentration in a region from a surface of the variable resistive material layer 142P. The annealing process may be or may include a thermal annealing process and/or a laser annealing process.

For example, referring to FIG. 13A together, before forming the first variable resistive material layer 142_1 and forming the second variable resistive material layer 142_2, a plasma processing process PP and/or an annealing process on the first variable resistive material layer 142_1 may be performed to change the oxygen vacancy concentration. Thereafter, after forming the second variable resistive material layer 142_2, an additional plasma treatment process PP and/or an additional annealing process may be performed or may not be performed.

A change in oxygen vacancy concentration in a width direction of the variable resistive material layer 142, e.g., an oxygen vacancy concentration profile or an oxygen vacancy concentration distribution, may be determined, for example, by one or more of Energy Dispersive X-ray Spectroscopy (EDS), X-ray Photoelectron Spectrometry (XPS), Secondary Ion Mass Spectrometry (SIMS), Rutherford back-scattering (RBS), Raman spectroscopy, Mott-Schottky impedance spectroscopy, x-ray crystallography (XRD), or the like.

Referring to FIGS. 10B and 16 to 19, a core insulating pattern 145 may be formed to cover the variable resistive material layer 142 and fill at least a portion of the opening OP (S25). The forming a core insulating pattern 145 (S25) may include forming a first core insulating layer 145A, partially removing the first core insulating layer 145A and the variable resistive material layer 142 from upper portions thereof, respectively, filling the opening OP with a second core insulating layer 145B, and forming the core insulating pattern 145 by partially removing the first and second core insulating layers 145A and 145B from upper portions thereof.

First, the first core insulating layer 145A may be formed to conformally cover an inner side surface of the variable resistive material layer 142 in the opening OP. Next, the first core insulating layer 145A and the variable resistive material layer 142 may be partially removed from upper portions thereof, to lower heights of upper ends thereof, compared to an upper end of the gate insulating layer 141. Next, the second core insulating layer 145B may fill an entirely unfilled space of the opening OP. An interface between the first core insulating layer 145A and the second core insulating layer 145B may be seen, depending on process conditions, but may not be clearly distinguished. Next, a planarization process such as a chemical mechanical planarization process and/or an etch-back process may be performed to remove a portion of the second core insulating layer 145B covering an upper end of the gate insulating layer 141. A space for forming a subsequent pad pattern 149 may be formed in the opening OP by partially removing the first and second core insulating layers 145A and 145B from upper portions thereof.

Referring to FIGS. 10A, 10B, 20, and 21, a pad pattern 149 may be formed on the core insulating pattern 145 (S26). The forming a pad pattern 149 (S26) may include forming a capping material layer 149P on the core insulating pattern 145, and performing a planarization process such as a chemical mechanical planarization process and/or an etch-back process to remove a portion of the capping material layer 149P disposed on the upper end of the gate insulating layer 141. During the planarization process, a portion of the gate insulating layer 141 on an uppermost interlayer insulating layer 120 may also be removed. Therefore, channel structures CH passing through the preliminary stacked structure may be formed (S20).

Figure 22:
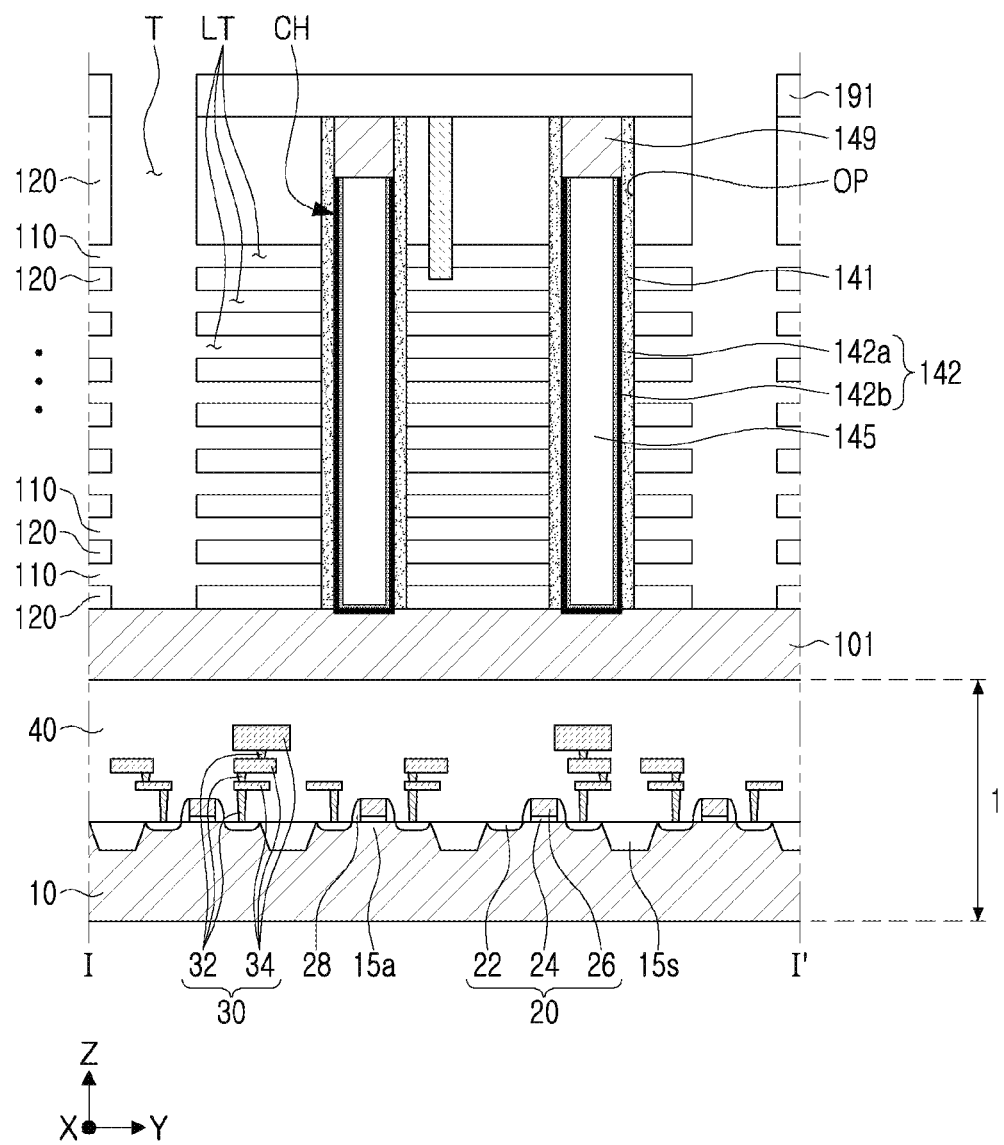

Referring to FIG. 22, separation openings T passing through the sacrificial layers 110 and the interlayer insulating layers 120 may be formed, and the sacrificial layers 110 may be removed through the separation openings T to form horizontal openings LT.

First, after the channel structure CH is formed, a first upper insulating layer 191 may be formed on the channel structure CH. The separation openings T may be formed by forming a mask layer and anisotropically etching the first upper insulating layer 191, the sacrificial layers 110, and the interlayer insulating layers 120, using a photolithography process. The separation openings T may be formed in a trench shape extending in the X-direction, and may expose the upper substrate 101 from lower ends of the separation openings T.

Next, the sacrificial layers 110 may be selectively removed with respect to the interlayer insulating layers 120 and the first upper insulating layer 191 through the separation openings T. Therefore, a plurality of horizontal openings LT may be formed between the interlayer insulating layers 120.

Figure 23:
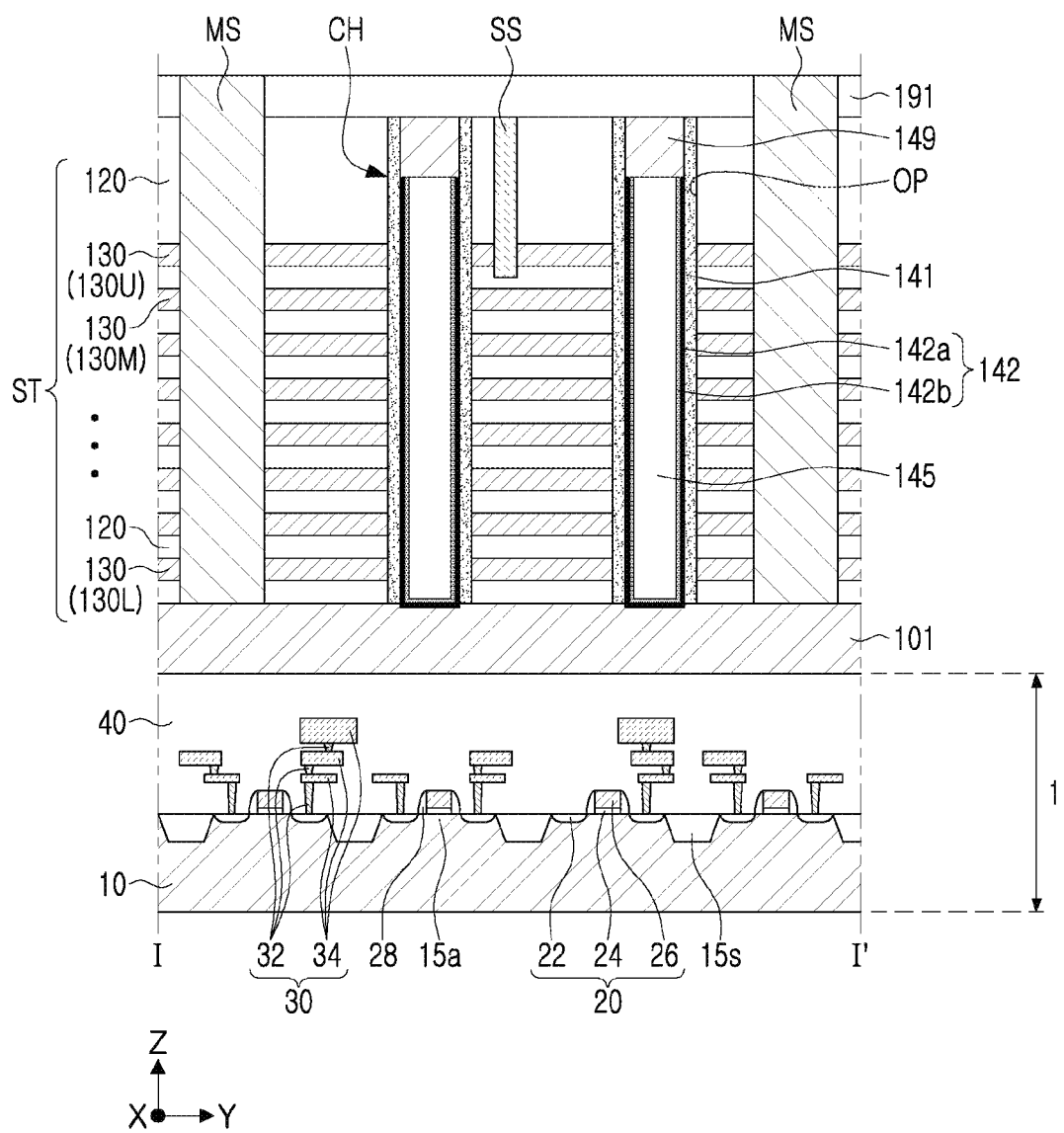

Referring to FIGS. 10A and 23, gate electrodes 130 may be formed in the horizontal openings LT, and first separation patterns MS may be formed in the separation openings T (S30).

First, the gate electrodes 130 may be formed by filling the horizontal openings LT, formed by removing the sacrificial layers 110 through the separation openings T, with a conductive material. Therefore, a stacked structure ST in which the interlayer insulating layers 120 and the gate electrodes 130 are alternately stacked may be formed. The forming the gate electrodes 130 may include sequentially forming a first layer and a second layer.

Next, the first separation patterns MS may be formed by filling the separation openings T with an insulating material. In some example embodiments, a separation insulating pattern including an insulating material and a conductive core pattern including a conductive material may be sequentially formed in the separation openings T. The conductive core pattern may be formed to be spaced apart from the gate electrodes 130 and to contact the upper substrate 101.

Next, a second upper insulating layer 192 may be formed, and contact plugs 170 and bit lines 180 may be formed (S40), to manufacture the semiconductor device 100 of FIGS. 1 to 3.

Figure 24:
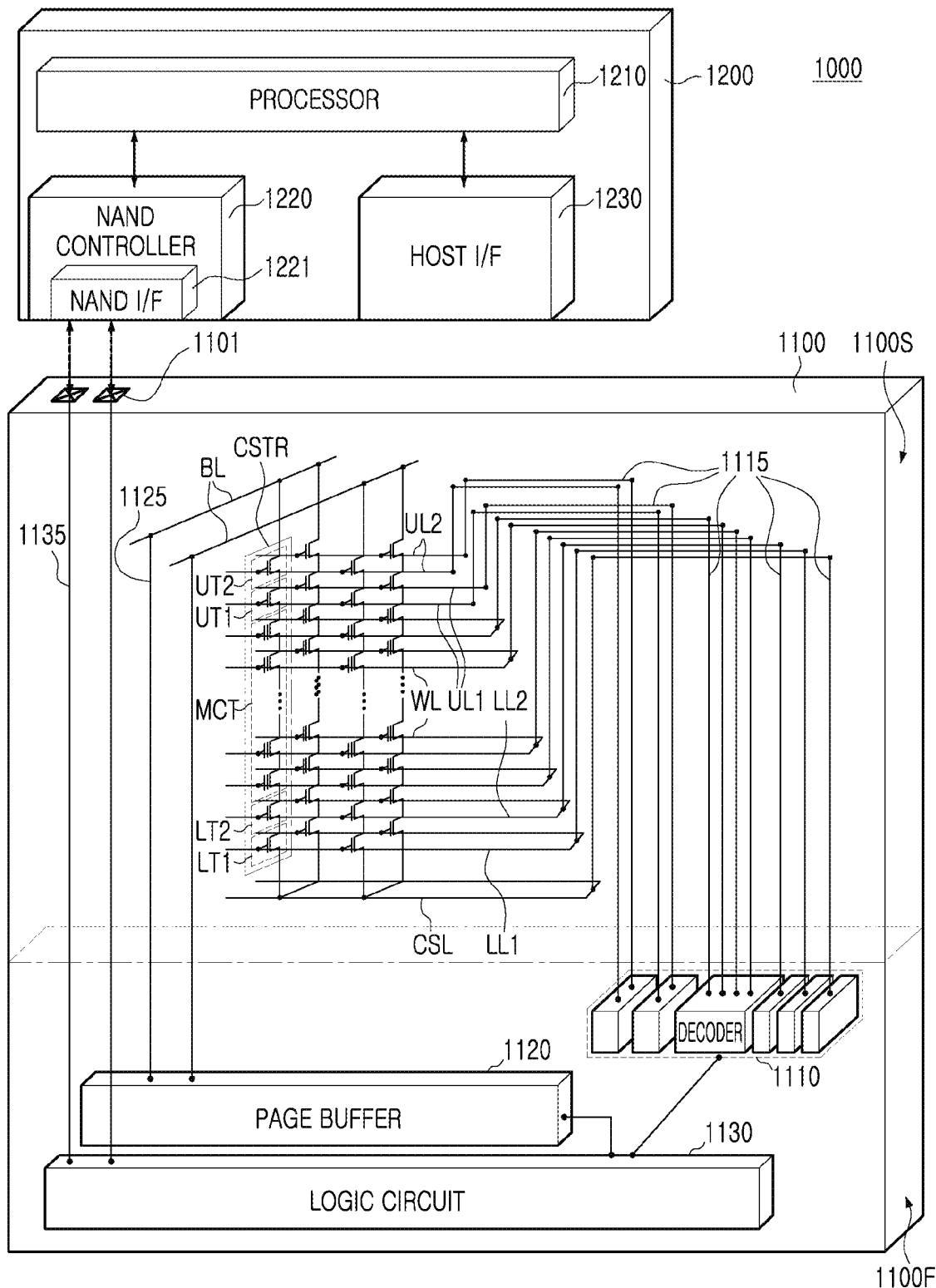
FIG. 24 is a view schematically illustrating a data storage system including a semiconductor device according to various example embodiments.

FIG. 24 is a view schematically illustrating a data storage system including semiconductor devices according to various example embodiments.

Referring to FIG. 24, a data storage system 1000 may include a semiconductor device 1100 and a controller 1200 electrically connected to the semiconductor device 1100. The data storage system 1000 may be a storage device including one or more semiconductor devices 1100, or an electronic device including the storage device. For example, the data storage system 1000 may be a solid state drive device (SSD), a universal serial bus (USB), a computing system, a medical device, or a communication device, including one or more semiconductor devices 1100.

The semiconductor device 1100 may be or may include a non-volatile memory device, for example, a NAND flash memory device described above with reference to FIGS. 1 to 9. The semiconductor device 1100 may include a first structure 1100F, and a second structure 1100S on the first structure 1100F. In some example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including bit lines BL, a common source line CSL, word lines WL, first and second gate upper lines UL1 and UL2, first and second gate lower lines LL1 and LL2, and memory cell strings CSTR between each of the bit lines BL and the common source line CSL.

In the second structure 1100S, each of the memory cell strings CSTR may include lower transistors LT1 and LT2 adjacent to the common source line CSL, upper transistors UT1 and UT2 adjacent to each of the bit lines BL, and a plurality of memory cell transistors MCT disposed between each of the lower transistors LT1 and LT2 and each of the upper transistors UT1 and UT2. The number of lower transistors LT1 and LT2 and/or the number of upper transistors UT1 and UT2 may be variously changed according to various example embodiments, and may be the same, or different, from each other.

In some example embodiments, each of the upper transistors UT1 and UT2 may include a string select transistor, and each of the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In some example embodiments, the lower transistors LT1 and LT2 may include a lower erase control transistor LT1 and a ground select transistor LT2, connected in series. The upper transistors UT1 and UT2 may include a string select transistor UT1 and an upper erase control transistor UT2, connected in series. At least one of the lower erase control transistor LT1 or the upper erase control transistor UT2 may be used for an erase operation of erasing data stored in the memory cell transistors MCT using a gate-induced-drain-leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection interconnections 1115 extending from the first structure 1100F into the second structure 1100S. The bit lines BL may be electrically connected to the page buffer 1120 through second connection interconnections 1125 extending from the first structure 1100F into the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through input/output connection interconnections 1135 extending from the first structure 1100F into the second structure 1100S.

The controller 1200 may include a processor 1210, a NAND controller 1220, and a host interface 1230. According to some example embodiments, the data storage system 1000 may include a plurality of semiconductor devices 1100, and in this case, the controller 1200 may control the plurality of semiconductor devices 1100.

The processor 1210 may control an overall operation of the data storage system 1000 including the controller 1200. The processor 1210 may operate according to a predetermined or alternatively variably determined firmware, and may access to the semiconductor device 1100 by controlling the NAND controller 1220. The NAND controller 1220 may include a NAND interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, or the like may be transmitted through the NAND interface 1221. The host interface 1230 may provide a communication function between the data storage system 1000 and an external host. When a control command is received from the external host through the host interface 1230, the processor 1210 may control the semiconductor device 1100 in response to the control command.

Figure 25:
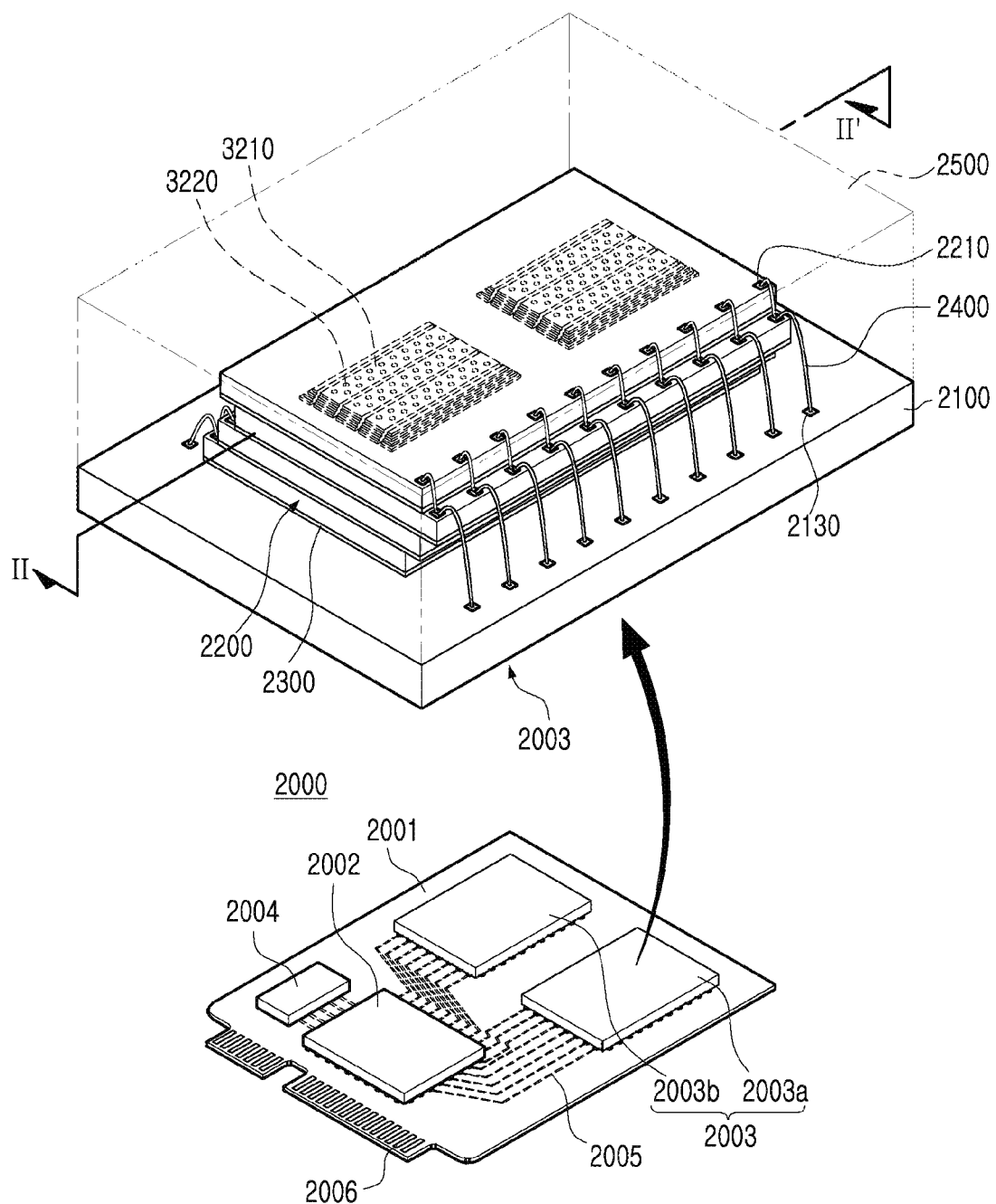
FIG. 25 is a perspective view schematically illustrating a data storage system including a semiconductor device according to various example embodiments.

FIG. 25 is a perspective view schematically illustrating a data storage system including a semiconductor device according to various example embodiments.

Referring to FIG. 25, a data storage system 2000 according to various example embodiments of inventive concepts may include a main substrate 2001, a controller 2002 mounted on the main substrate 2001, a semiconductor package 2003, which may be provided as one or more semiconductor packages, and a DRAM 2004. The semiconductor package 2003 and the DRAM 2004 may be connected to the controller 2002 by interconnection patterns 2005 formed on the main substrate 2001.

The main substrate 2001 may include a connector 2006 including a plurality of pins, which may be coupled to an external host. The number and an arrangement of the plurality of pins in the connector 2006 may vary according to a communication interface between the data storage system 2000 and the external host. In some example embodiments, the data storage system 2000 may be communicated with the external host according to any one interface of a universal serial bus (USB), peripheral component interconnection express (PCI-Express), serial advanced technology attachment (SATA), M-Phy for universal flash storage (UFS), or the like. In some example embodiments, the data storage system 2000 may be operated by power supplied from the external host through the connector 2006. The data storage system 2000 may further include a power management integrated circuit (PMIC) distributing power, supplied from the external host, to the controller 2002 and the semiconductor package 2003.

The controller 2002 may write data to the semiconductor package 2003 or read data from the semiconductor package 2003, and may improve an operation speed of the data storage system 2000.

The DRAM 2004 may be or may include a buffer memory reducing a difference in speed between the semiconductor package 2003, which may be a data storage space, and the external host. The DRAM 2004 included in the data storage system 2000 may also operate as a type of cache memory, and may provide a space temporarily storing data in a control operation on the semiconductor package 2003. When the DRAM 2004 is included in the data storage system 2000, the controller 2002 may further include a DRAM controller controlling the DRAM 2004 in addition to a NAND controller controlling the semiconductor package 2003.

The semiconductor package 2003 may include first and second semiconductor packages 2003a and 2003b, spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting each of the semiconductor chips 2200 and the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 24. Each of the semiconductor chips 2200 may include stacked structures 3210 and memory channel structures 3220. Each of the semiconductor chips 2200 may include a semiconductor device according to any one of embodiments described above with reference to FIGS. 1 to 9.

In some example embodiments, the connection structure 2400 may be a bonding wire electrically connecting the input/output pad 2210 and the upper package pads 2130. Therefore, in each of the first and second semiconductor packages 2003a and 2003b, the semiconductor chips 2200 may be electrically connected to each other by a bonding wire process, and may be electrically connected to the package upper pads 2130 of the package substrate 2100. According to embodiments, in each of the first and second semiconductor packages 2003a and 2003b, the semiconductor chips 2200 may be electrically connected to each other by a connection structure including a through silicon via (TSV), instead of a connection structure 2400 by a bonding wire process.

In some example embodiments, the controller 2002 and the semiconductor chips 2200 may be included in one (1) package. In some example embodiments, the controller 2002 and the semiconductor chips 2200 may be mounted on a further interposer substrate, different from the main substrate 2001, and the controller 2002 and the semiconductor chips 2200 may be connected to each other by an interconnection formed on the interposer substrate.

Figure 26:
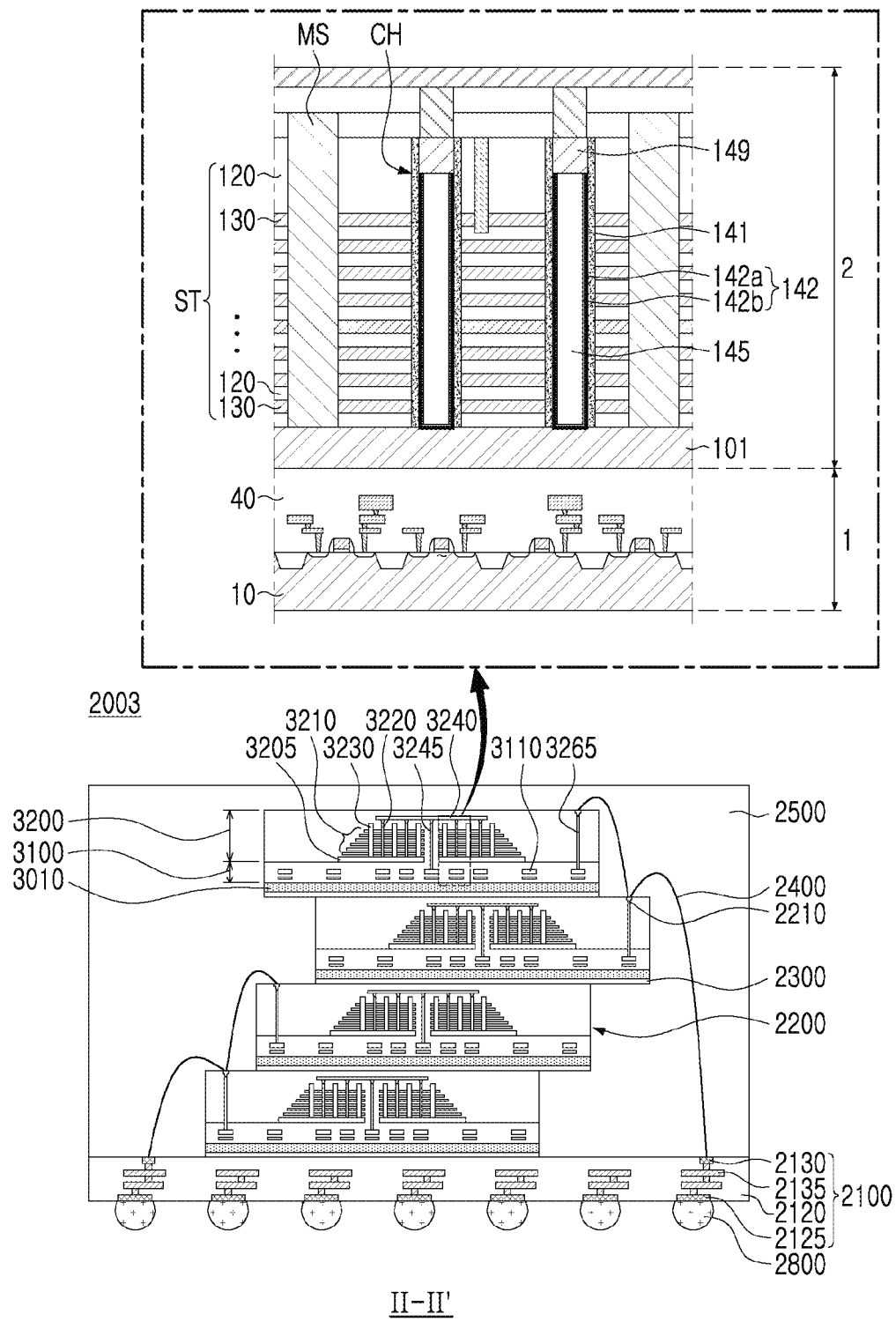
FIG. 26 is a cross-sectional view schematically illustrating a semiconductor package according to various example embodiments.

FIG. 26 is a cross-sectional view schematically illustrating a semiconductor package according to various example embodiments. FIG. 26 may illustrate various example embodiments of the semiconductor package 2003 of FIG. 25, and may conceptually illustrate a region taken along line II-II' of the semiconductor package 2003 of FIG. 25.

Referring to FIG. 26, in the semiconductor package 2003, the package substrate 2100 may be a printed circuit board. The package substrate 2100 may include a package substrate body portion 2120, package upper pads 2130 disposed on an upper surface of the package substrate body portion 2120 (see FIG. 25), lower pads 2125 disposed on a lower surface of the package substrate body portion 2120 or exposed from the lower surface, and internal interconnections 2135 electrically connecting the upper pads 2130 and the lower pads 2125 in the package substrate body portion 2120. The upper pads 2130 may be electrically connected to the connection structures 2400. The lower pads 2125 may be connected to the interconnection patterns 2005 of the main substrate 2001 of the data storage system 2000, as illustrated in FIG. 25, through conductive connection portions 2800.

Each of or at least some of the semiconductor chips 2200 may include a semiconductor substrate 3010, and a first structure 3100 and a second structure 3200, sequentially stacked on the semiconductor substrate 3010. The first structure 3100 may include a peripheral circuit region including peripheral interconnections 3110. The second structure 3200 may include a common source line 3205, a stacked structure 3210 on the common source line 3205, channel structures 3220 and separation regions 3230, passing through the stacked structure 3210, bit lines 3240 electrically connected to the memory channel structures 3220, and gate contact plugs 3235 electrically connected to word lines WL (refer to FIG. 24) of the stacked structure 3210. As described above with reference to FIGS. 1 to 9, each of the semiconductor chips 2200 may include a lower substrate 10, circuit elements 20, an upper substrate 101, gate electrodes 130, channel structures CH, first separation patterns MS, second separation patterns SS, and bit lines 180.

Each of or at least some of the semiconductor chips 2200 may include a through-interconnection 3245 electrically connected to the peripheral interconnections 3110 of the first structure 3100 and extending into the second structure 3200. The through-interconnection 3245 may disposed outside the stacked structure 3210, and may be further disposed to pass through the stacked structure 3210. Each of the semiconductor chips 2200 may further include an input/output pad 2210 electrically connected to the peripheral interconnections 3110 of the first structure 3100 (refer to FIG. 25).

A method of manufacturing a semiconductor device having improved electrical characteristics and a simplified manufacturing process, in which a variable resistive material layer includes a channel region having a high oxygen vacancy concentration and a data storage region having a low oxygen vacancy concentration, may be provided.

Various advantages and effects of inventive concepts are not limited to the above, and will be more easily understood in the process of describing specific example embodiments of inventive concepts.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While various example embodiments have been illustrated and described above, it will be apparent to those skilled in the art that modifications and variations could be made without departing from the scope of inventive concepts as defined by the appended claims. Furthermore example embodiments are not necessarily mutually exclusive with one another. For example, some example embodiments may include one or more features described with reference to one or more figures, and may also include one or more other features described with reference to one or more other figures.

What is claimed is:

1. A method of manufacturing a semiconductor device, comprising:
   forming a stacked structure by stacking gate layers and interlayer insulating layers alternately on a substrate; and
   forming a channel structure that passes through the stacked structure in a vertical direction,
   wherein the forming a channel structure includes,
   forming an opening by etching the stacked structure,
   forming a gate insulating layer covering at least a side surface of the opening,
   forming a variable resistive material layer on the gate insulating layer,
   changing an oxygen vacancy concentration in a region of the variable resistive material layer by performing one or both of a plasma treatment process on the variable resistive material layer or an annealing process on the variable resistive material layer,
   forming a core insulating pattern covering the variable resistive material layer and filling at least a portion of the opening, after performing the one or both of plasma treatment process or the annealing process, and
   forming a pad pattern on the core insulating pattern.

2. The method of claim 1, wherein the variable resistive material layer is formed by the one or both of the plasma treatment process or the annealing process to include a channel region including oxygen vacancies at a first concentration, and a data storage region including oxygen vacancies at a second concentration, less than the first concentration.

3. The method of claim 2, wherein the channel region of the variable resistive material layer is formed to contact the gate insulating layer and to extend along a side surface of the gate insulating layer, and
   the data storage region of the variable resistive material layer is formed to contact the core insulating pattern and to extend along a side surface of the core insulating pattern.

4. The method of claim 2, wherein the data storage region of the variable resistive material layer is formed to be farther from the side surface of the opening, compared to the channel region.

5. The method of claim 1, wherein the variable resistive material layer is formed of a transition metal oxide.

6. The method of claim 1, wherein the variable resistive material layer is formed of at least one of hafnium oxide (HfO), zinc oxide (ZnO), indium oxide (InO), gallium oxide (GaO), tin oxide (SnO), copper oxide (CuO), molybdenum oxide (MoO), hafnium-silicon oxide (HSO), hafnium-zinc oxide (HZO), indium-zinc oxide (IZO), indium-gallium oxide (IGO), indium-tin oxide (ITO), indium-gallium-zinc oxide (IGZO), or indium-tin-zinc oxide (ITZO).

7. The method of claim 1, wherein the annealing process includes one or both of a thermal annealing process or a laser annealing process.

8. The method of claim 1, wherein the forming a variable resistive material layer on the gate insulating layer comprises:
   forming a first layer including a transition metal oxide on the gate insulating layer; and
   forming a second layer including a transition metal oxide on the first layer.

9. The method of claim 8, wherein the one or both of plasma treatment process or the annealing process is performed on at least one of the first layer or the second layer.

10. The method of claim 9, wherein an oxygen vacancy concentration in the transition metal oxide of the first layer increases in the first layer by the plasma treatment process.

11. The method of claim 9, wherein an oxygen vacancy concentration in the transition metal oxide of the second layer decreases in the second layer by the annealing process.

12. The method of claim 1, wherein the forming a variable resistive material layer on the gate insulating layer comprises:
   forming a variable resistive material capping layer filling the opening; and
   etching a central region of the variable resistive material capping layer to form the variable resistive material layer extending along a side surface of the gate insulating layer and having a specific thickness from the side surface of the gate insulating layer.

13. The method of claim 1, wherein the forming a core insulating pattern comprises:
   forming a first core insulating layer conformally on the variable resistive material layer;

removing a portion of the first core insulating layer and a portion of the variable resistive material layer from upper portions thereof, respectively;

forming a second core insulating layer filling the opening and contacting the first core insulating layer; and forming the core insulating pattern by removing a portion of the first core insulating layer and a portion of the second core insulating layer from upper portions thereof, and the forming a pad pattern comprises:

forming a pad space by removing an upper portion of the core insulating pattern; and forming the pad pattern by depositing a conductive material in the pad space.

14. A method of manufacturing a semiconductor device, comprising:

forming a stacked structure by stacking gate layers and interlayer insulating layers alternately on a substrate; and forming a channel structure passing through the stacked structure in a vertical direction, wherein the forming a channel structure includes, forming an opening by etching the stacked structure, forming a gate insulating layer covering at least a side surface of the opening;

forming a variable resistive material layer on the gate insulating layer and including a first region and a second region, changing an oxygen vacancy concentration in either of the first region or the second region, forming a core insulating pattern filling at least a portion of the opening, and forming a pad pattern on the core insulating pattern.

15. The method of claim 14, wherein the variable resistive material layer is formed of a transition metal oxide.

16. The method of claim 14, wherein the changing an oxygen vacancy concentration in either of the first region or the second region comprises decreasing an oxygen vacancy concentration in the second region, compared to an oxygen vacancy concentration in the first region, wherein the first region is in contact with the gate insulating layer, and the second region is in contact with the core insulating pattern.

17. The method of claim 14, wherein the variable resistive material layer has an oxygen vacancy concentration profile gradually decreasing along a width of the variable resistive material layer in a direction from the gate insulating layer toward a central region of the channel structure.

18. The method of claim 14, further comprising:

forming a separation opening passing through the stacked structure;

removing the gate layers through the separation opening; and forming gate electrodes by filling regions from which the gate layers are removed with a conductive material.

19. A method of manufacturing a semiconductor device, comprising:

forming a stacked structure by stacking gate layers and interlayer insulating layers alternately on a substrate; and forming a channel structure passing through the stacked structure in a vertical direction, wherein the forming a channel structure comprises, forming an opening by etching the stacked structure, forming a gate insulating layer in the opening, forming a variable resistive material capping layer filling the opening and contacting the gate insulating layer, etching a central region of the variable resistive material capping layer to form a variable resistive material layer extending along a side surface of the gate insulation layer and having a specific thickness from the side surface of the gate insulation layer, changing an oxygen vacancy concentration in a region of the variable resistive material layer by performing one or both of a plasma treatment process on the variable resistive material layer or an annealing process on the variable resistive material layer;

forming a core insulating pattern that covers the variable resistive material layer and that fills at least a portion of the opening, after performing the one or both of the plasma treatment process or the annealing process; and forming a pad pattern on the core insulating pattern.

20. The method of claim 19, wherein the annealing process includes one or both of a thermal annealing process or a laser annealing process, the variable resistive material layer is formed by the plasma treatment process or the annealing process to include a channel region including oxygen vacancies at a first concentration, and a data storage region including oxygen vacancies at a second concentration, less than the first concentration, wherein the channel region is formed in a portion of the variable resistive material layer contacting the gate insulating layer, and the data storage region is formed in a portion of the variable resistive material layer contacting the core insulating pattern.

* * * * *